United States Patent [19]
Ota et al.

[11] Patent Number: 5,619,488
[45] Date of Patent: Apr. 8, 1997

[54] INFORMATION RECORDING DEVICE

[75] Inventors: Takeshi Ota; Masao Ito, both of Kanagawa, Japan

[73] Assignee: Fuji Xerox Co., Ltd., Tokyo, Japan

[21] Appl. No.: 386,594

[22] Filed: Feb. 10, 1995

Related U.S. Application Data

[63] Continuation of Ser. No. 941,155, Sep. 4, 1992, abandoned.

[30] Foreign Application Priority Data

Sep. 7, 1991 [JP] Japan .................................. 3-227532
May 1, 1992 [JP] Japan .................................. 4-112906

[51] Int. Cl.⁶ .................................................. G11B 7/00
[52] U.S. Cl. ................................. 369/112; 369/121
[58] Field of Search ........................ 369/44.11, 44.12, 369/44.23, 44.24, 112, 44.37, 124, 121, 122, 109, 110, 111, 118, 44.14; 359/625, 204, 211; 372/50, 96, 98

[56] References Cited

U.S. PATENT DOCUMENTS

| | | | |
|---|---|---|---|
| 3,980,818 | 9/1976 | Browning | 360/32 |
| 4,425,636 | 1/1984 | Musha et al. | 369/44.37 |
| 4,727,381 | 2/1988 | Bille et al. | 369/44.37 |
| 4,743,091 | 5/1988 | Gelbart | 369/112 |
| 4,813,762 | 3/1989 | Leger et al. | 359/629 |
| 4,851,978 | 7/1989 | Ichihara | 359/205 |
| 4,935,939 | 6/1990 | Liau et al. | 372/98 |
| 4,963,900 | 10/1990 | Budd et al. | 359/206 |
| 4,969,137 | 11/1990 | Sugiyama et al. | 369/32 |
| 4,974,919 | 12/1990 | Muraki et al. | 359/206 |
| 5,005,969 | 4/1991 | Kataoka | 359/629 |

(List continued on next page.)

FOREIGN PATENT DOCUMENTS

| | | | |
|---|---|---|---|
| 0388760 | 9/1990 | European Pat. Off. | 369/44.37 |
| 3827761 | 4/1989 | Germany | 369/44.12 |
| 54-7328 | 1/1979 | Japan . | |
| 54-38130 | 3/1979 | Japan . | |
| 56-110960 | 9/1981 | Japan . | |
| 59-15218 | 1/1984 | Japan . | |
| 61-216132 | 9/1986 | Japan | 369/44.37 |
| 61-269237 | 11/1986 | Japan | 369/44.12 |
| 62-291728 | 12/1987 | Japan | 369/44.12 |
| 2-39583 | 2/1990 | Japan . | |
| 2-239433 | 9/1990 | Japan | 369/44.37 |
| 9000135 | 8/1990 | Netherlands | 369/44.12 |

OTHER PUBLICATIONS

"Properties of Closely Spaced Independently Addressable Lasers Fabricated Impurity–induced Disordering," R.L. Thornton et al., Appl. Phys. Lett. 56(17), pp. 1623–1625, 23 Apr. 1990.

National Convention Record of IEICE, N. Yamamoto et al., p. 1083, 1983.

"Low Aberration Visible Micro–Collimated Laser Diode," M. Yoneda et al. the 1990 IEICE Spring National Convention Record, p. C–265, 1990.

(List continued on next page.)

Primary Examiner—Nabil Hindl
Attorney, Agent, or Firm—Finnegan, Henderson, Farabow, Garrett & Dunner, L.L.P.

[57] ABSTRACT

An information recording device having a light source unit including a plurality of laser light sources which are substantially linearly arrayed and independently driven, a deflecting unit for periodically deflecting a plurality of beams of laser light emitted from the light source unit in a direction crossing that of an array of the beams, and an image forming optical system for focusing the plurality of laser beams from the deflecting unit on a photoreceptor. In the information recording device, optical units for reducing divergence of the laser beams are provided in connection with the laser light sources of the light source unit.

5 Claims, 28 Drawing Sheets

U.S. PATENT DOCUMENTS

| | | | |
|---|---|---|---|
| 5,009,472 | 4/1991 | Morimoto | 359/206 |
| 5,072,437 | 12/1991 | Chikuma | 369/118 |
| 5,084,895 | 6/1992 | Shimada et al. | 371/50 |
| 5,105,407 | 4/1992 | Ishika | 369/44.37 |
| 5,121,378 | 6/1992 | Hirose et al. | 369/118 |
| 5,126,995 | 6/1992 | Nishizawa | 369/44.24 |
| 5,128,919 | 7/1992 | Nagahara et al. | 369/124 |
| 5,132,959 | 7/1992 | Ishika | 369/110 |
| 5,148,010 | 9/1992 | Mori | 369/44.23 |
| 5,168,401 | 12/1992 | Endriz | 359/625 |
| 5,172,369 | 12/1992 | Chikuma et al. | 369/44.14 |
| 5,185,752 | 2/1993 | Welch et al. | 372/96 |
| 5,208,456 | 5/1993 | Appel et al. | 359/204 |
| 5,225,924 | 7/1993 | Ogawa et al. | 389/211 |
| 5,233,583 | 8/1993 | Reno | 369/44.37 |
| 5,379,266 | 1/1995 | Russell | 369/103 |
| 5,465,243 | 11/1995 | Boardman et al. | 369/44.37 |

OTHER PUBLICATIONS

"Laser Diode Integrated with Microlens (II)," J. Shimada et al, the 1991 IEICE Spring National Convention Record, p. C–251, 1991.

"Lasing Characteristics of a Continuous–Wave Operated Foleded–Cavity Surface–Emitting Laser," T. Takamori et al., Appl. Phys. Lett. 56(23), pp. 2267–2269, 4 Jun. 1990.

"Array of Distributed–Index Planar Micro–Lense Prepared from Ion Exchange Technique," M. Oikawa et al., Japanese Journal of Applied Physics, vol. 20, No. 4, pp. L296–L298, Apr., 1981.

"Spacing of Laser Diode Array for Multi–Beam Laser Printer Using Interlaced Scanning," T. Ota et al., Extended Abstract, The Japan Society of Applied Physics (Autumn Meeting), 11p–ZM–19, 1991.

"Microlens Fabricated by the Planar Process," J. Shimada et al., Journal of Lightwave Technology, vol. 9, No. 5, pp. 571–576, May 1991.

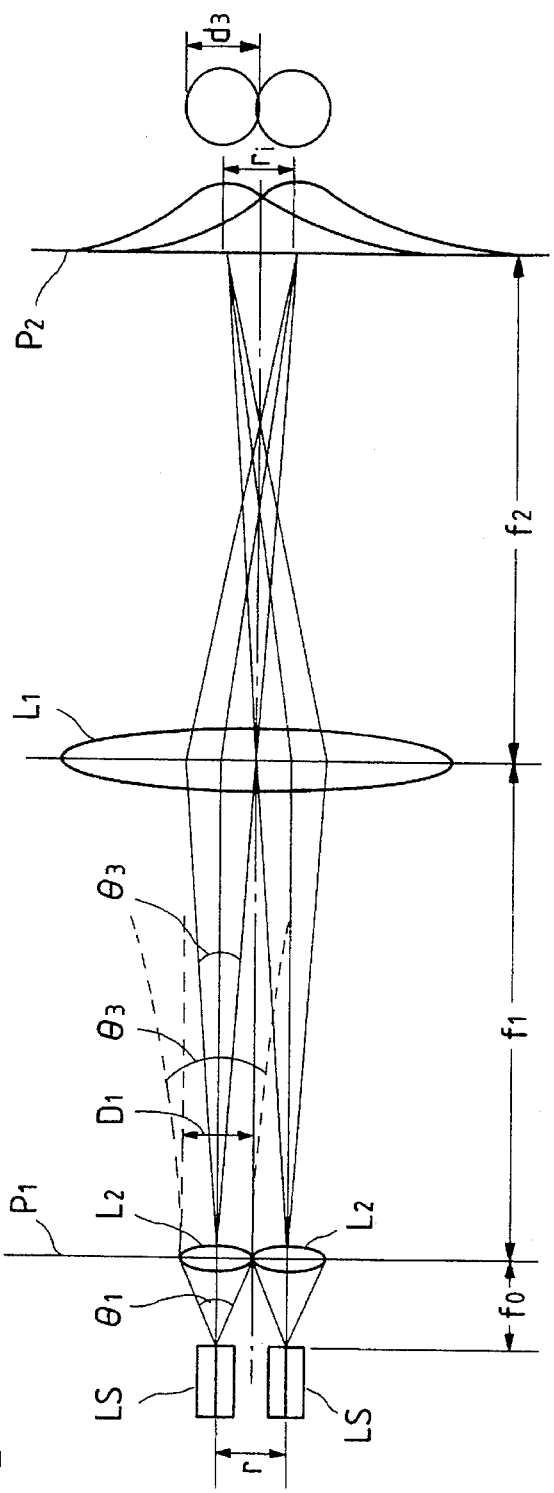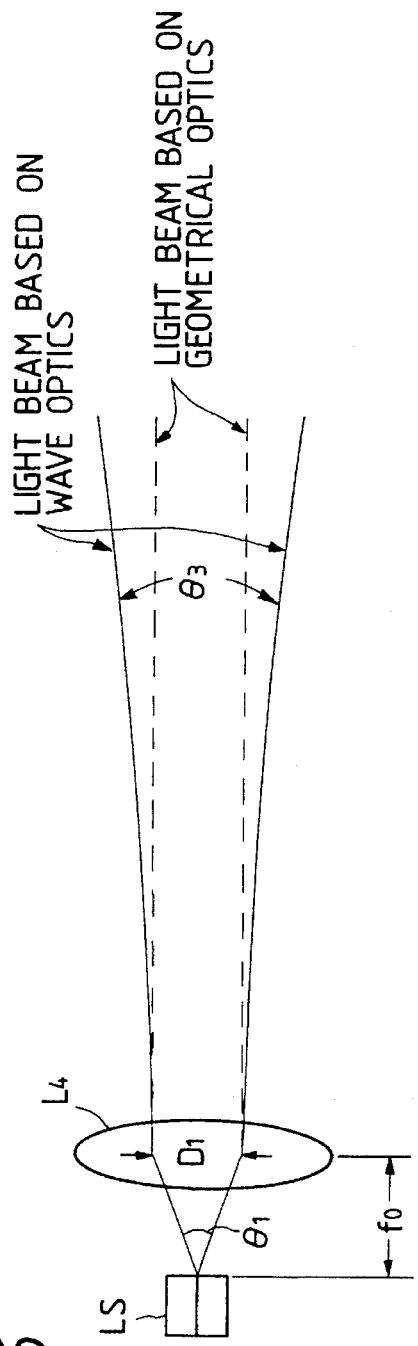
FIG. 5
FIG. 6

INTENSITY

INTENSITY

INFORMATION RECORDING DEVICE

This application is a continuation of application, Ser. No. 07/941,155, filed Sep. 4, 1992, now abandoned.

BACKGROUND OF THE INVENTION

1. Field of the Invention

The present invention relates to an information recording device, such as a digital copying machine, a laser beam printer or an optical disk system, and more particularly to an information recording device of the type in which a plurality of light sources, such as a multibeam semiconductor array, are used and the surface of an object to be scanned is simultaneously scanned with a plurality of scan lines.

2. Discussion of the Related Art

In the laser beam printer, for example, a laser beam modulated by an image signal is applied to a polygon scanner revolving at a high speed. The laser beam is reflected by the scanner, and scans the surface of a recording medium, e.g., a photoreceptor, in the main scan direction, to form a latent image on the surface. The latent image is developed into a toner image. The toner image is transferred onto a sheet of recording paper.

In this type of laser beam printer, to increase a resolution of an image or to reduce the time taken for the image formation, it is necessary to increase the revolving speed of the polygon scanner. However, physical restrictions, such as weight of the polygon scanner and torque of a drive motor, hinders the increase of the revolving speed of the polygon scanner.

To solve the problem, a multibeam scan system in which the surface of the scanned object is simultaneously scanned with a plurality of beams, has been proposed and put into practice. In this scan system, as a matter of course, a plurality of beam spots must be arrayed in a manner that those spots are made satisfactorily close to each other in the direction (referred to as a subsidiary scan direction) orthogonal to the scan direction (referred to as a main scan direction) of the scan by the polygon scanner. Aggressive efforts to manufacture a plurality of semiconductor lasers close together have been made and now progress. The spot-to-spot distance of 10 μm has been achieved in the semiconductor laser arrays thus far proposed (reference is made to Japanese Patent Unexamined Publication No. Hei. 2-39583 and R. L. Thornton et al., "Properties of Closely Spaced Independently Addressable Lasers Fabricated by Impurity-Induced Disordering" Appl. Phys. Lett. 56 (17), 1623–1625 (1990)).

Also, there are optical approaches to reduce the spot-to-spot distance of the laser beams, as disclosed in Japanese Patent Unexamined Publication No. Sho. 54-7328, which uses an optical fiber or an optical waveguide for the spot-to-spot distance reduction, and Japanese Patent Unexamined Publication No. Sho. 59-15218, which uses a prism or a reflecting mirror. Additionally, Japanese Patent Unexamined Publication No. Sho. 54-38130 effectively reduces the spot-to-spot distance in the subsidiary scan direction by inclining a semiconductor laser array. Japanese Patent Unexamined Publication No. Sho. 56-110960 uses the interlaced scanning method to fill the spaces each between the adjacent laser beam spots through a plural number of scans.

An example of the spot-to-spot distance reduction method based on the interlaced scanning is shown in FIG. 19. In this example, two laser beams LB1 and LB2 are used for the interlaced scanning. In FIG. 19, $d_x$ represents the diameter of a laser beam spot that is electrophotographically defined. The laser beam spot diameter is the diameter of the spot of an image that is formed by using a laser beam having a certain light intensity distribution, and will be referred to as an electrophotographic spot diameter. The spot diameter of a laser beam is generally defined as the diameter of the beam spot of which the circumference is at an intensity of light $1/e$ ($1/e^2$ in power) as great as the light intensity at the center of the beam spot. The spot diameter thus defined is called an optical spot diameter and denoted as $d_0$. In the description to follow, the imagery spot diameter of the laser beam will be based on the optical spot diameter, unless otherwise noted.

A relationship between the optical spot diameter and the electrophotographic spot diameter is graphically illustrated in FIG. 20. A ratio of the optical spot diameter $d_0$ to the electrophotographic spot diameter $d_x$ is called a spot-diameter correction coefficient "k". The spot-diameter correction coefficient "k" is mathematically defined as $$k = d_0/d_x \quad (1)$$

The value of the spot-diameter correction coefficient "k" depends on the electrophotographic process used. In the process of the charged-area development where toner is attached to an area exposed to light, the coefficient "k" is preferably selected to be within $1.4 \leq k \leq 1.6$, while in the process of discharged area development where toner is attached to an area not exposed to light, it is preferably selected to be within $1.5 \leq k \leq 1.8$.

The center-to-center distance $r_3$ between the two spots imaged on the surface P0 to be scanned by the two laser beams LB1 and LB2 is given by $r_3 = 3d_x$. The subsidiary scan progresses by $2d_x$ every main scan. Accordingly, as shown in FIG. 19, in the first scan, the second scan line is traced by the laser beam LB2. In the second scan, the first scan line is traced by the laser beam LB1, and the fourth scan line is traced by the laser beam LB2. Thus, a gap is formed for each scan; however, in a scan, the first laser beam of the paired ones traces a first scan line, and in the next scan, the second laser beam skips over the previously traced scan line and traces a second scan line. In this way, the scan lines are successively traced in a gapless fashion.

If the already-described semiconductor laser array having the light emitting points closely arrayed at 10 μm spatial intervals (Japanese Patent Unexamined Publication No. Hei. 2-39583), is operated in the interlaced scanning mode as shown in FIG. 19, the resultant multibeam laser beam printer, in principle, would be high in definition and operating speed.

However, it is very difficult to actually manufacture the semiconductor laser array having the light emitting spots arrayed at the 10 μm-intervals for the multibeam laser beam printer, for the following reasons. When the adjacent light emitting spots or semiconductor laser elements are spaced by 10 μm, the thermal crosstalk between the adjacent elements becomes problematic. It was confirmed that to reduce the thermal crosstalk to such a value as to be practically negligible, the oscillation threshold value of each semiconductor laser element must be reduced to approximately 10 mA. In the case of a semiconductor laser of AlGaAs, which oscillates at approximately 780 nm in the spectrum of the infrared rays, the semiconductor laser element of such a low oscillation threshold value can be manufactured by using the technique at the present stage. In the case of a semiconductor laser of AlGaInP, which oscillates at further shorter wavelength of 680 nm, the laser elements that can be manufactured are only those each oscillating at an oscillation threshold value several times as large as that of the laser element of the AlGaAs laser.

The laser beam printer employs the electrophotographic process. The electrophotography was developed, at the beginning, for the copying machine in which the photoreceptor is exposed directly to light reflected from an original document. Some of the photoreceptors specially designed for the laser beam printer are sensitive to the infrared rays of approximately 780 nm. Such photoreceptors are unsatisfactory in lifetime and reliability performances. The photoreceptors sensitive to the infrared rays are not required for the usual copying machine. If the wavelength of laser light emitted from a semiconductor laser light source could be confined within the visible spectrum, the photoreceptor may be used for both the laser beam printer and the normal copying machine. This leads to cost reduction. Also in a case where the AlGaAs semiconductor laser oscillating at approximately 780 nm is used, when a large optical power is required for a high speed printer, a large current must be fed when it is driven, if only the threshold value is reduced. Also in this case, the thermal crosstalk problem also arises.

As described above, it is desirable to manufacture a semiconductor laser array using the AlGaInP semiconductor laser oscillating at approximately 680 nm in the visible spectrum. However, it is difficult to manufacture, by the present technique, a semiconductor laser array, which consists of the laser elements arrayed at 10 μm intervals, oscillates at approximately 680 nm, and has a satisfactorily suppressed thermal crosstalk. Also in a case where the semiconductor laser having a low threshold value and oscillating at approximately 780 μm, is used, it is difficult to manufacture a large power semiconductor laser array, which consists of semiconductor elements spaced by 10 μm and has a satisfactorily suppressed thermal crosstalk.

SUMMARY OF THE INVENTION

The present invention has been made in view of the above circumstances and has an object to provide an information recording device which can reduce the distance between imagery spots by laser beams on a photoreceptor without reducing the distance between semiconductor laser elements of a semiconductor laser array.

In order to attain the above object, the present invention provides an information recording device including: light source means including a plurality of laser light sources which are substantially linearly arrayed and independently driven; deflecting means for periodically deflecting a plurality of beams of laser light emitted from the light source means in a direction crossing that of an array of the beams; an image forming optical system for focusing the plurality of laser beams from the deflecting means on a photoreceptor; and optical means for reducing divergence of the laser beams in connection with the laser light sources of the light source means.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

FIG. 5 is a view showing the optical system of FIG. 1 in which laser beams are geometrical-optically converted into parallel laser beams;

FIG. 6 is a view showing the parallel laser beams exhibiting an wave-optically diverging nature;

DETAILED DESCRIPTION OF THE PREFERRED EMBODIMENTS

The present invention will be described with reference to the accompanying drawings.

In the present invention, optical means for reducing the divergence of laser light is provided in connection with the laser light sources of the light source means.

With the provision of the optical means, the divergence angle of laser light can be reduced, so that the distance between the imagery spots formed on the image plane can effectively be reduced. This will be described in detail.

Figure 1:
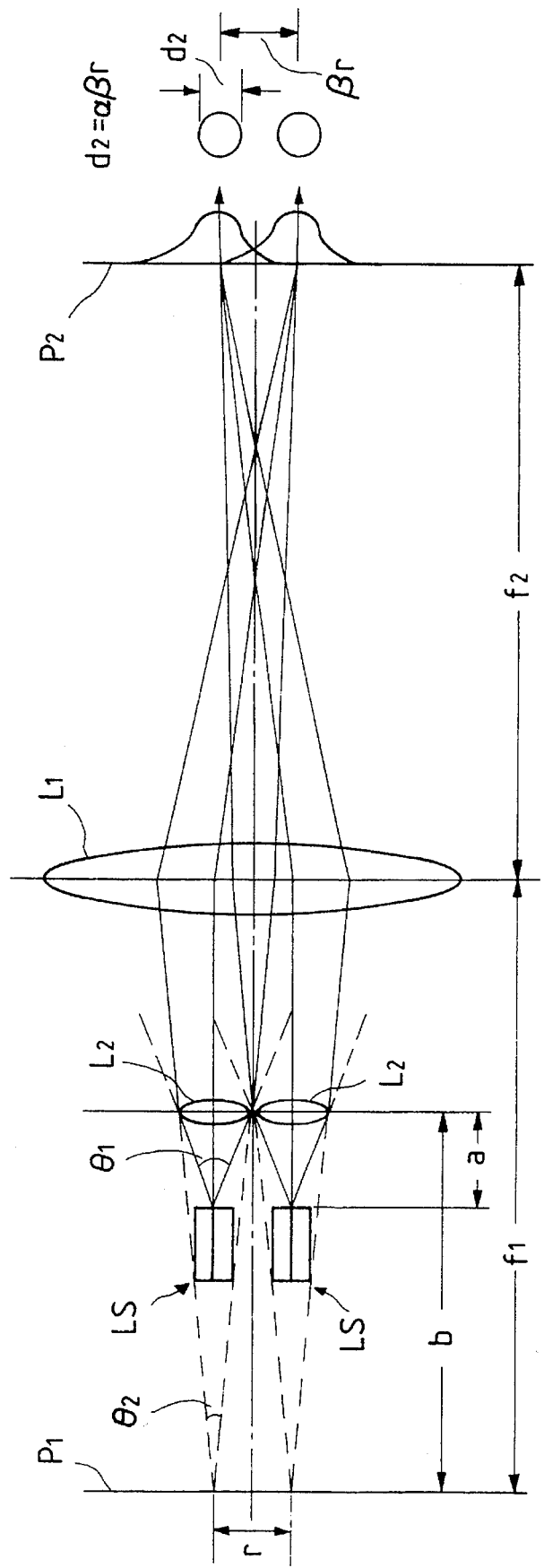
FIG. 1 is a view showing the construction of an information recording device of the invention, in which two laser light sources are respectively followed by two lenses.
Figure 2:
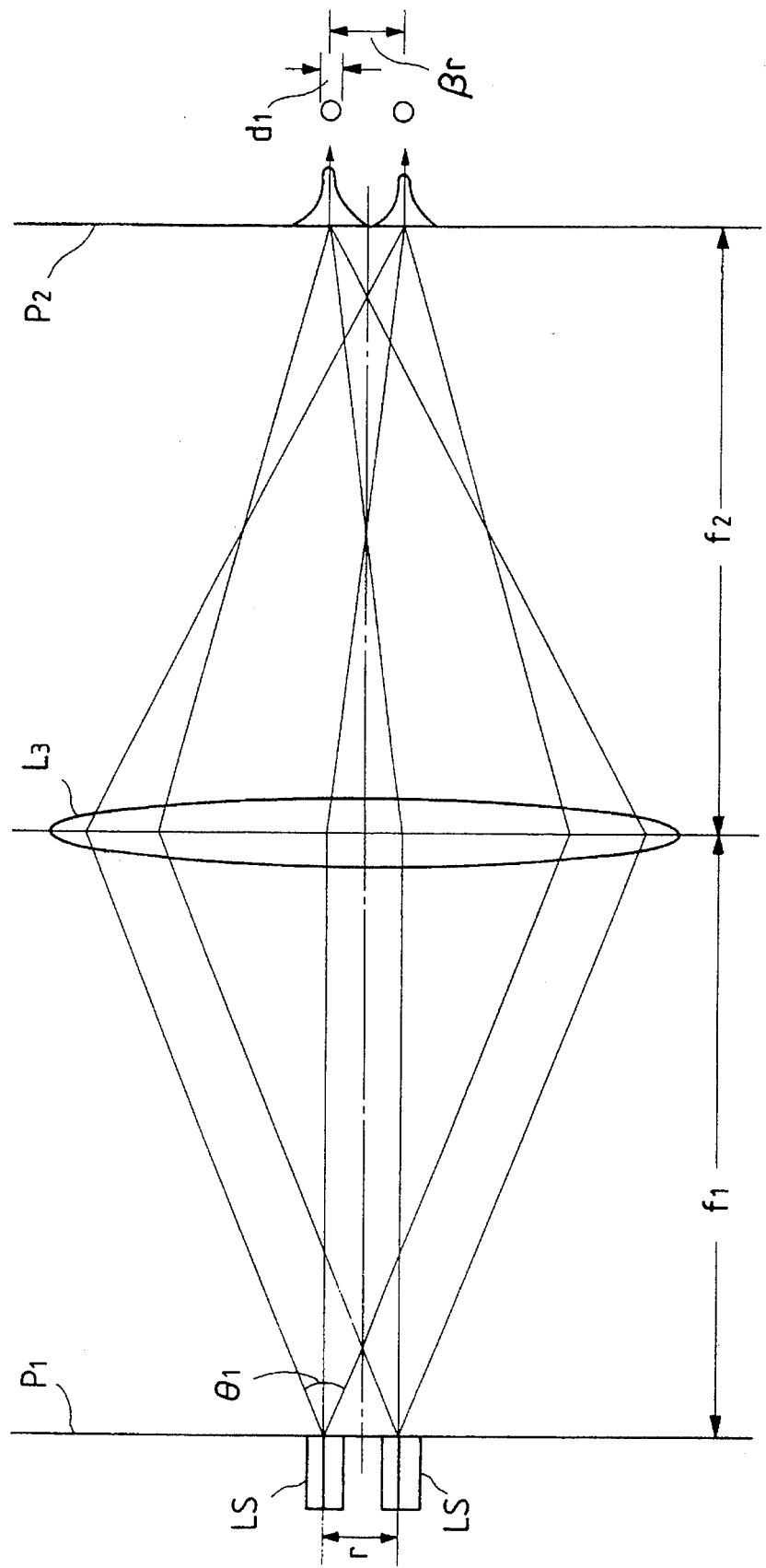
FIG. 2 is a view showing an optical system in which two laser light sources are followed by a single lens.
Figure 3:
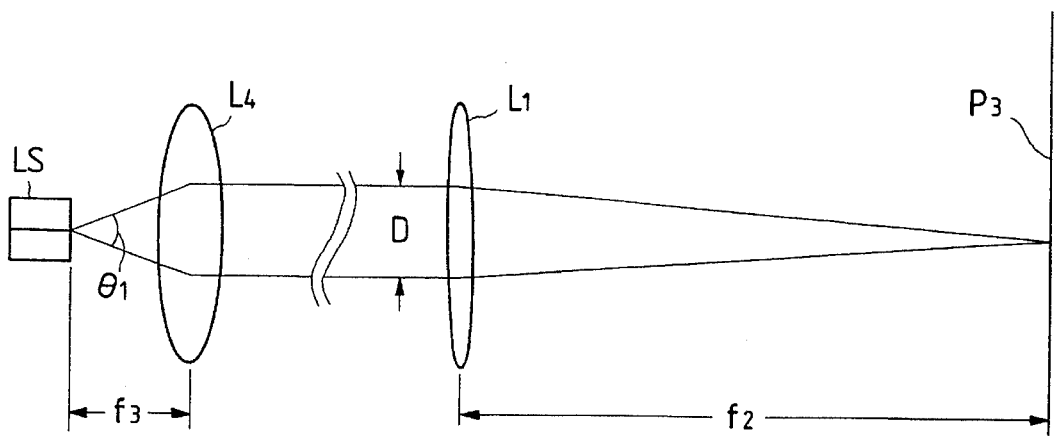
FIG. 3 is a view showing a model of an image forming optical system.

FIG. 1 is an explanatory diagram showing the principle of the present invention. A plurality of (two in this instance) laser light sources LS emit laser light each at divergence angle $\theta_1$. The laser light then passes through a lens $L_2$ which reduces the divergence angle of laser light to $\theta_2$. As a result, the laser light sources LS are equivalently positioned at an apparent light source plane P1 in FIG. 1 when optically viewed through an image forming lens $L_1$. With presence of the lens $L_1$, the light source plane P1 and an image forming plane P2 are optically conjugate. When lateral magnification $\beta=f_2/f_1$, an imagery spot diameter of the laser beam on the image forming plane P2 is designated by $d_2$. Here, $f_1$ indicates a distance between the apparent light source plane P1 and the lens $L_1$, and $f_2$ indicates a distance between the lens $L_1$ and the image forming plane P2. In a case where the lens $L_2$ is not used as shown in FIG. 2, and $\beta=f_2/f_1$, the diameter of an imagery spot of the laser beam that is formed on the image forming plane P2 by the lens $L_3$, is denoted as $d_1$. When comparing the above two optical systems, the distance "r" between the laser light sources LS, that is, the distance "r" between the imagery spots, in one optical system is equal to that in the other optical system, but the spot diameter $d_2$ is larger than the spot diameter $d_1$. The reason why the spot diameter $d_2$ is larger than the spot diameter $d_1$ will be described below with reference to FIG. 3.

Figure 4:
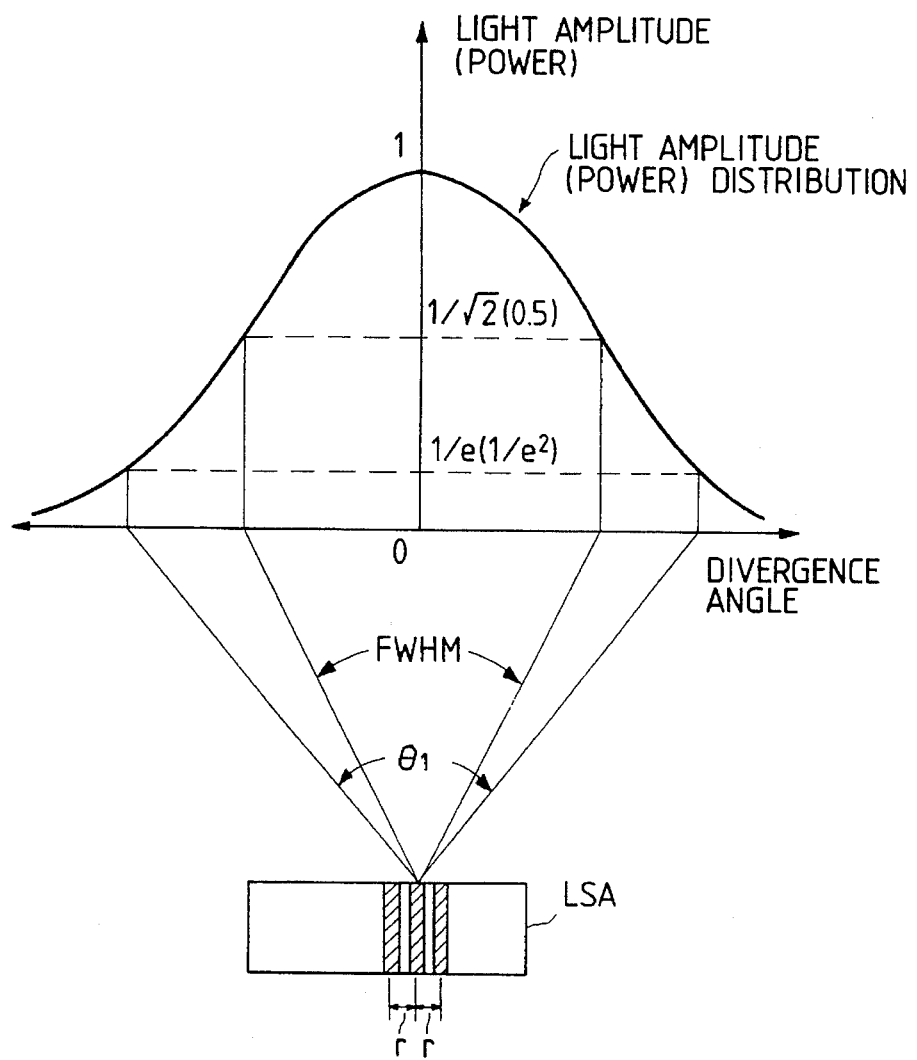
FIG. 4 is a graphical representation of a divergence angle dependency of the intensity of laser light emitted from a semiconductor laser.

As known, the diameter $d_0$ of a beam spot on the image plane P3 is given by $$d_0=4f_2\lambda/\pi D$$

where D: Beam diameter of laser beam incident on the image forming optical system $\lambda$: Wave length $f_2$: Focal distance of the image forming optical system $\pi$: Circular constant The $d_0$ is the optical spot diameter of which the circumference has a light amplitude $1/e$ ($1/e^2$ in power) as large as that at the spot center. The diameter D of the laser beam incident on the image forming optical system is given by $$D=2f_3\sin(\theta_1/2)$$

where $\theta_1$: Divergence angle of laser light from the laser light source LS $f_3$: Focal length of a collimator lens $L_4$ The divergence angle $\theta_1$ of the laser light is such an angle that when the light intensity on the principal line of the laser light is normalized at 1, the light amplitude per unit angle is $1/e$ ($1/e^2$ in power), as shown in FIG. 4. In the example shown in FIG. 4, a semiconductor laser array LSA in which the distance between the adjacent light emitting elements is "r" is used for the laser light sources LS. In a case where the light source is a semiconductor laser, the divergence angle of laser light is frequently expressed in terms of an angle (FWHM: Full Width at Half Mean) where the light intensity per unit angle on the principal laser light is halved (1/√2 in the light amplitude). In using the divergence angle, this should be beared in mind.

When the lateral magnification β of the image forming system is $f_2/f_1$, i.e., $\beta=f_2/f_1$, in the subsidiary scan direction, the diameter of the imagery spot of the laser beam on the image plane P3 when viewed in the subsidiary scan direction, is given by $$d_0 = 2\lambda\beta/\pi\sin(\theta_1/2) \quad (2)$$

The equation indicates that the diameter $d_0$ is uniquely determined by the lateral magnification β and the divergence angle $\theta_1$.

When the relation of equation (2) is applied to the optical systems of FIGS. 1 and 2, the spot diameters $d_1$ and $d_2$ are expressed by $$d_1 = 2\lambda\beta/\pi\sin(\theta_1/2)$$

$$d_2 = 2\lambda\beta/\pi\sin(\theta_2/2)$$

A relationship between the divergence angles $\theta_1$ and $\theta_2$, when $\alpha=a/b$, may be expressed by the following equation, using a formula of imagery relation in the geometrical optics.

$$\theta_2 = a\theta_1/b = \alpha\theta_1$$

where a: Distance between the laser light source LS and the lens $L_2$
b: Distance between the apparent light source plane P1 and the lens $L_2$ From the above equations, a relationship between the spot diameters $d_1$ and $d_2$ may be expressed by $$d_2 = \alpha\beta d_1 \quad (3)$$

The distance between two spots on the imagery plane is βr. Therefore, if α is varied while β is fixed, the imagery spot diameter may be increased while keeping the imagery spot distance on the imagery plane at a fixed value. If by utilizing this, the lateral magnification β of the imagery optical system is properly adjusted to gain a desired line-to-line distance, the spot-to-spot distance is effectively reduced. Thus, in the present invention, the spot diameter and the spot-to-spot distance on the imagery plane can be changed by properly adjusting α and β.

Also in the present invention, the optical means for reducing the divergence of laser light is a collimator optical system for arranging the laser beams into substantially parallel beams geometrical-optically, and the principal plane of the collimator optical system on the image side and the image-formed surface of the photoreceptor are disposed in an optically conjugate relationship in the image forming optical system.

The construction of the information recording device of the invention as just mentioned can further reduce the divergence angle of the laser light.

The construction of the information recording device may be depicted as shown in FIG. 5. The operation of the construction of the information recording device will be described. Let us consider a case where the laser beams are collimated by the lenses $L_2$ in FIG. 1. In this case, when considering this from the point of view of geometrical optics, the apparent light source plane is located at infinity and $\theta_2=0$. When more strictly examining it from the point of view of wave optics, the divergence angle $\theta_2$ should be a certain divergence angle $\theta_3$, which is not 0. In FIG. 5, $f_0$ is a focal length of the lens $L_2$.

In an optical system as shown in FIG. 6, the divergence angle $\theta_3$ is given by $$\theta_3 = 2\sin^{-1}(2\lambda/\pi D_1) \quad (4)$$

where $D_1$: Beam diameter of the laser beam geometrical-optically collimated.

Equation (4) equivalently indicates that the laser light source of the divergence angle $\theta_3$ is located at the position of a collimator lens $L_4$. Accordingly, as shown in FIG. 5, the principal plane (apparent light source plane) P1 of the collimator lens $L_2$ on the image side and the image plane (image forming plane) P2 are optically conjugate. Under this condition, the diameter $d_3$ of an imagery spot on the image forming plane P2 is given by $$d_3 = 2\lambda\beta/\pi\sin(\theta_3/2) \quad (5)$$

In the above equation, $\beta=f_2/f_1$. Substituting equation (4) into equation (5), then we have $$d_3 = \beta D_1 \quad (6)$$

The distance $r_i$ of the imagery spots on the scanned plane (image forming plane) P2 is given by the following equation $$r_i = \beta r \quad (7)$$

In the above calculations, the truncation effect of the laser beams by the lens $L_2$ are not taken into account. In a case where the effective diameter of the lens $L_2$ is finite, equation (4) can be rewritten into $$\theta_3 = 2\sin^{-1}(2\lambda/\pi D_1)A \quad (8)$$

In the above equation, A represents an apodization constant. Typical values of the apodization constant A are as follows: A=1.39 when the laser light is employed at the diameter where the power of the laser light is $1/e^2$ as great as that at the center, and A=1.97 when the laser light is employed at the diameter where the power of the laser light is ½ as great as that at the center. When the effective diameter of the lens $L_2$ is infinite, A=1. Such a phenomenon is called an apodization of the laser light. When considering the phenomenon, the portion in an optical system where the diffraction is the greatest must be scrutinized. In a case where as in the first embodiment of the invention to be given later, the lens $L_2$ is followed by a smaller stop, a divergence angle is first calculated using equation (4), and then an apodization for the smaller stop must be calculated.

In the information recording device of the invention, a laser array taking the form of a monolithic or single piece is used as the light source. A microlens array taking the form of a monolithic or single piece is used as the lens $L_2$ shown in FIGS. 1 or 5. The construction makes it easy to realize the information recording apparatus having the construction as just mentioned. The term "microlens array" means a lens array consisting of a group of miniature lenses each having the diameter in the range of approximately 10 μm to several mm.

Figure 7:
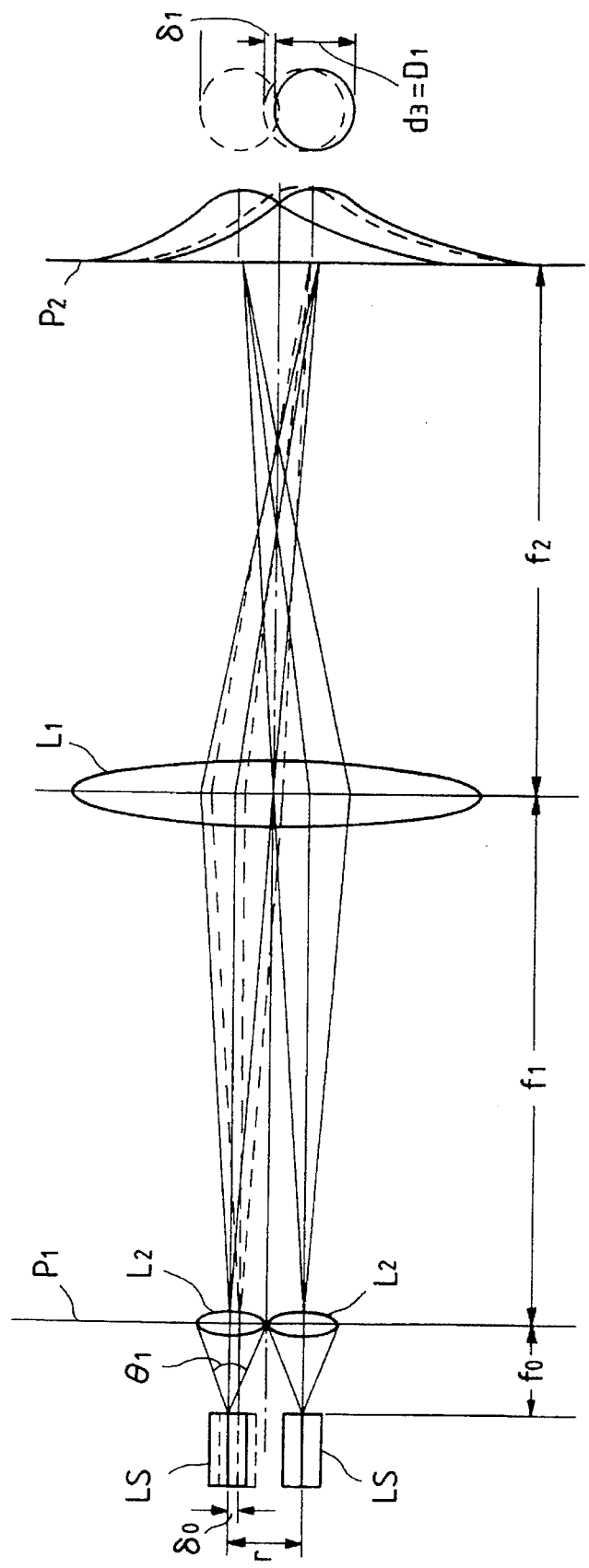
FIG. 7 is a view showing the optical system of FIG. 5 in which one of the laser elements of the laser light source is displaced from the proper place.

An alignment precision of a lens will be described when the microlens array as a single piece is not used. It is assumed that one of the laser light sources LS, as shown in FIG. 7, is displaced by distance $\delta_0$ from the proper place in the direction vertical to the optical axis. In this case, the imagery spot is displaced from the normal place on the image plane P2 by distance $\delta_1$ as given by the following equation.

$$\delta_1 = \beta \delta_0 \quad (9)$$

Considering a case where the optical system as shown in FIG. 5 is used for an actual laser beam printer, $\beta \approx 1/16$ as will be described in the first embodiment to be given later. In a laser beam printer of 800 spi (800 spots per inch) in resolution, the electrophotographic spot diameter $d_x$ is approximately 30 μm. when involving the spot diameter correction coefficient "k", the optical spot diameter $d_0$ on the image plane P2 is approximately 50 μm. A tolerable error of the position of the imagery spot on the image plane P2 is approximately 5% of the electrophotographic spot diameter. Then, $\delta_1 \approx 1.5$ μm, and hence $\delta_0 = 24$ μm.

The microlens is a miniature lens of 0.1 to several mm in diameter, as stated above. A minimum diameter of the microlens that can be manufactured by using the technique at the present stage is several hundreds μm. If the distance between the microlenses is 500 μm, the manufacturing precision is in the order of $\delta_0/r = 4.8 \times 10^{-2}$. Practically, it is difficult to gain this figure by arraying and mechanically adjusting the individual microlenses. The same thing is applicable for the laser light source. However, when the laser arrays and the microlens arrays are fabricated using photolithography, the precision in this order can easily be achieved. The dimensional precision of the photo-mask which the present technique can achieve is at least $10^{-6}$. In the microlens array made of plastic or glass that is fabricated by an injection molding method, the precision of $4.8 \times 10^{-2}$ can be achieved.

Figure 8:
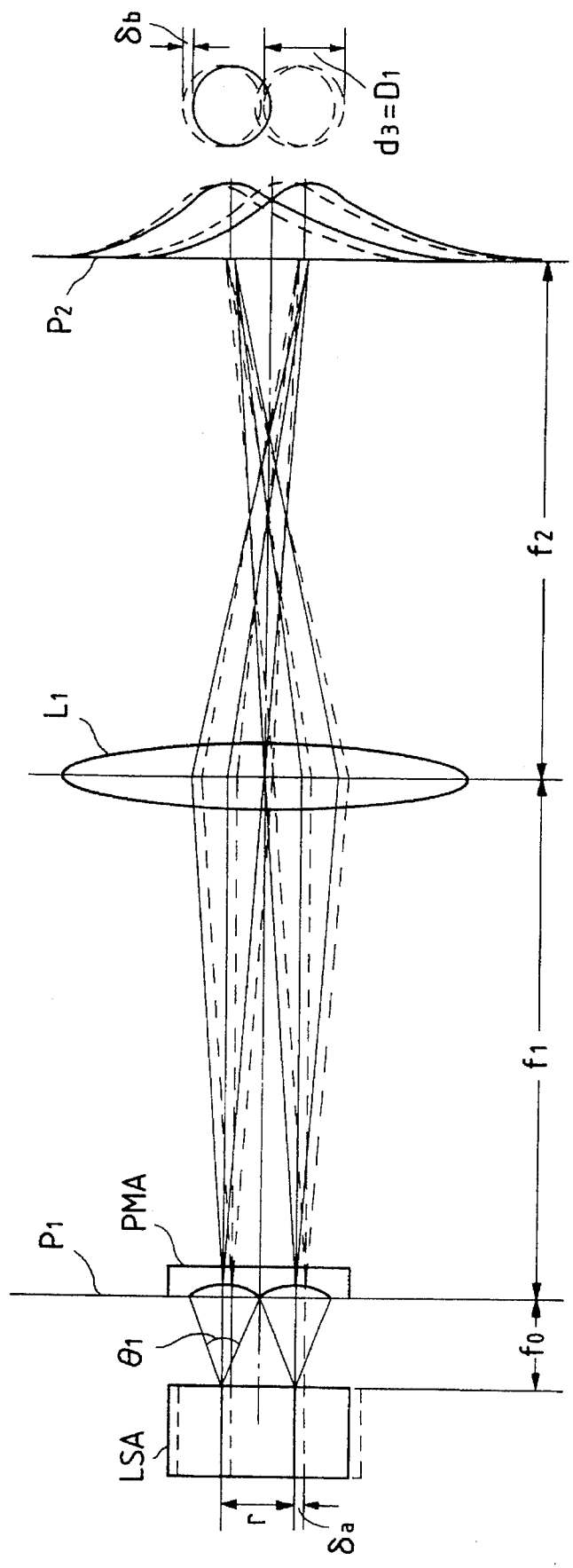
FIG. 8 is a view showing the optical system of FIG. 5 in which a laser array and a lens array are respectively used for the laser light source and the lens, and the laser array and the lens array are relatively displaced from each other.

Let us consider an alignment precision of the laser array and the microlens array when those are used. In the description, it is assumed that those arrays have no dimensional error, and that as shown in FIG. 8, a semiconductor laser array LSA and a microlens array PMA are both displaced from the proper place by distance $\delta_a$. As seen also from FIG. 7 already referred to, the two imagery spots are displaced in the same direction and by the same amounts of space, $\delta_b = \beta \delta_a$. However, in the multibeam laser beam printer, such an absolute displacement is not problematic in practical use. What is essential to this type of the printer is the relative positional relationship between the two spots.

Another construction of the invention further improves the alignment adjustment of the single piece laser array and the single piece microlens array. The space between the imagery spots on the image plane must be reduced in only the array direction of the laser array. Therefore, reduction of the divergence angle of the laser light only in the array direction of the laser array suffices. To this end, the laser array is constructed such that it consists of a cylindrical lens array, and the direction in which the cylindrical lens array exhibits a lens function is substantially coincident with the array direction of the laser array. With such a construction, only the divergence angle of the laser light in the array direction of the laser array can be reduced. In this case, displacement of the microlens array or the laser array in the direction in which the cylindrical lens array does not exhibit a lens function, will have no effect on the image formation of the laser beam. Therefore, poor alignment precision in this direction is allowed.

Further, in the invention, a semiconductor laser array is formed on a single substrate by photolithography process of high precision. Therefore, the precision, $\delta_0/r = 4.8 \times 10^{-2}$, can be realized, which is required for the element-to-element distance in the laser array.

In the invention, the microlens array is a cylindrical lens array disposed such that the direction in which the cylindrical lens array exhibits a lens function is substantially coincident with the array direction of the laser array.

Figure 9:
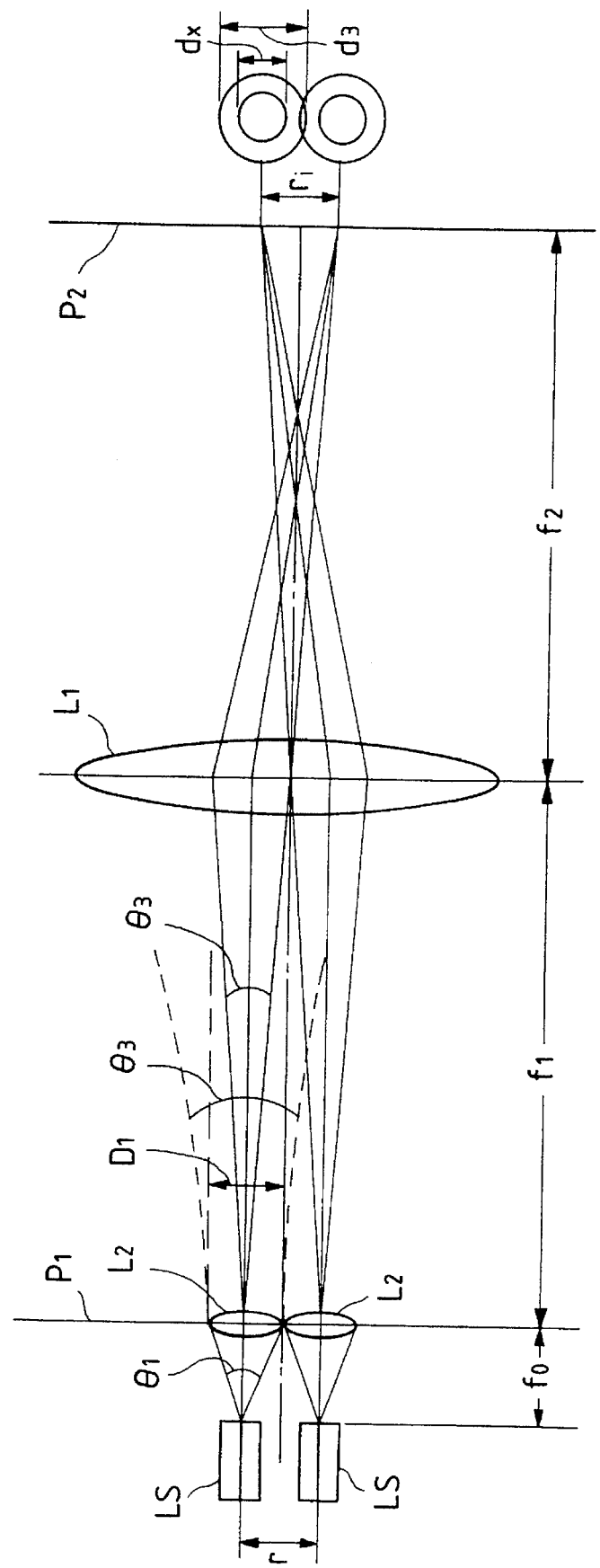
FIG. 9 is a view showing the optical system of FIG. 5 in which the imagery spots are made insufficiently close to each other when considering it from the electrophotographic view point.

This construction can narrow the space between the imagery spots on the image plane satisfactorily in practical use while minimizing the loss of the light quantity. In the electrophotographic process, the optimum value of the spot diameter correction coefficient "k" is approximately 1.5, $k \approx 1.5$. As seen from equation (1), the electrophotographic spot diameter $d_x$ is smaller than the optical spot diameter $d_0$. Rearranging equations (6) and (7), we have $d_3/r_f = D_1/r$. Thence, even if the end-to-end distance between the paired lens elements of the lens $L_2$, as shown in FIG. 9, is reduced to as short as possible, it is impossible to make the imagery spots satisfactorily close to each other electrophotographically. That is, since the diameter of the lens is substantially equal to the optical spot diameter, it is impossible to make the imagery spots satisfactorily close to each other electrophotographically unless the two lens elements overlap.

One of the approaches to solve the problem is provision of an optical stop at a proper location as in the first embodiment to be given later. This approach suffers from large loss of light quantity, though. Application of interlaced scanning to the information recording device thus constructed can prevent such loss of light quantity.

Examples of the information recording device based on the technical ideas mentioned above will be described.

Figure 10:
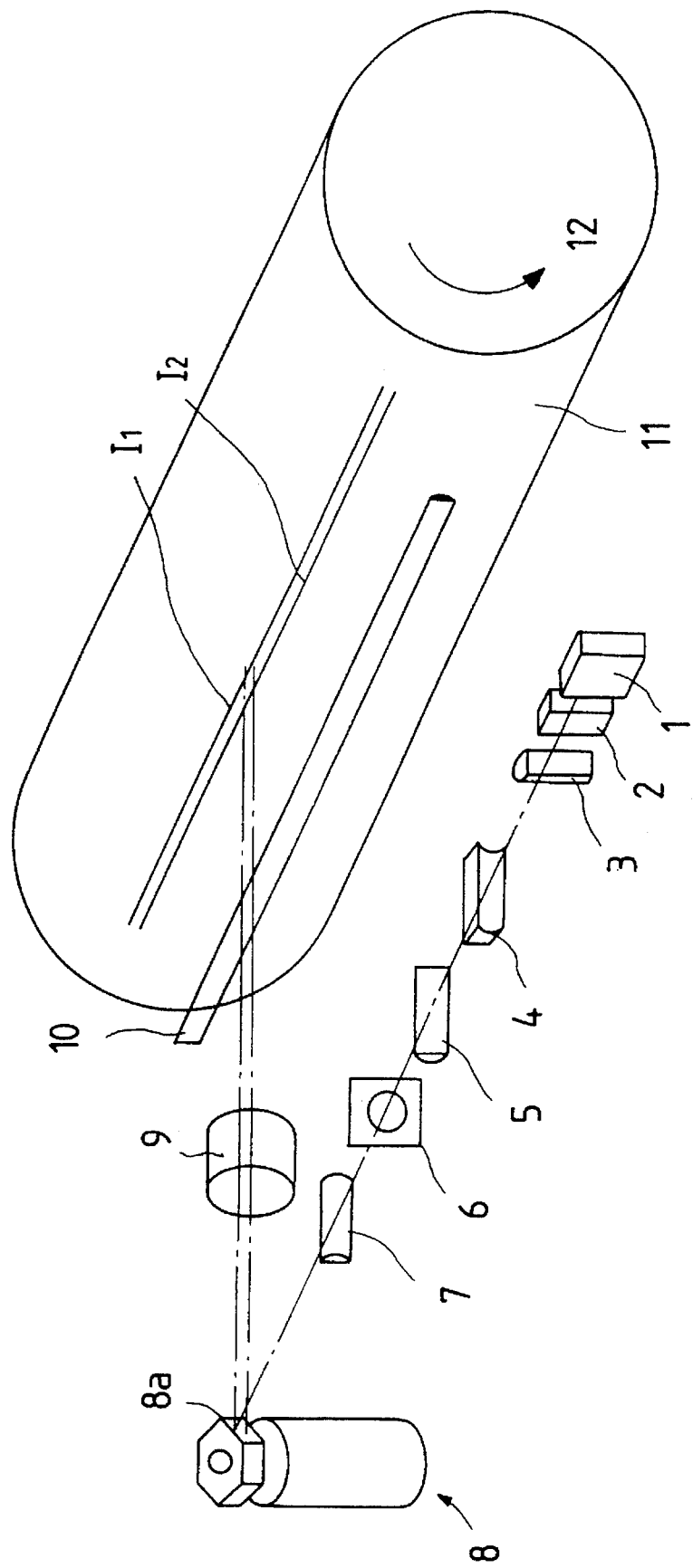
FIG. 10 is a perspective view showing the construction of an embodiment of an information recording device according to the present invention.
Figure 11:
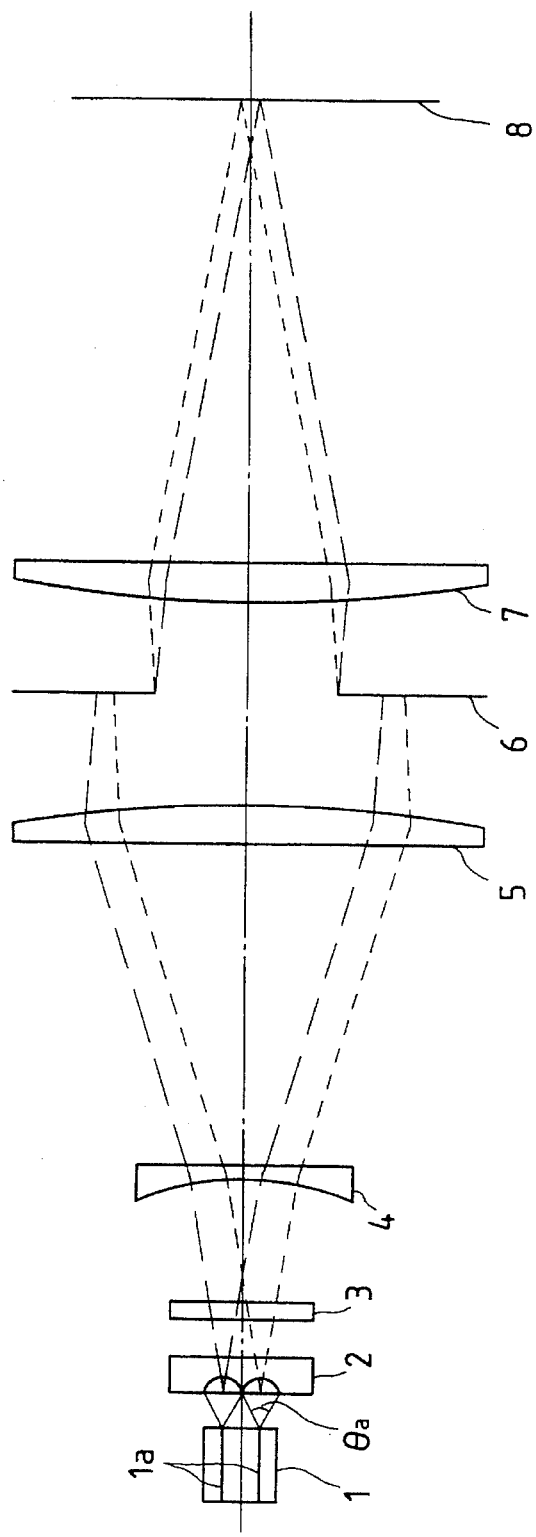
FIG. 11 is a development showing an optical system upstream of a polygon scanner of the information recording device of FIG. 10 as viewed in the plane, which is orthogonal to the plane of deflection and includes an optical axis.
Figure 12:
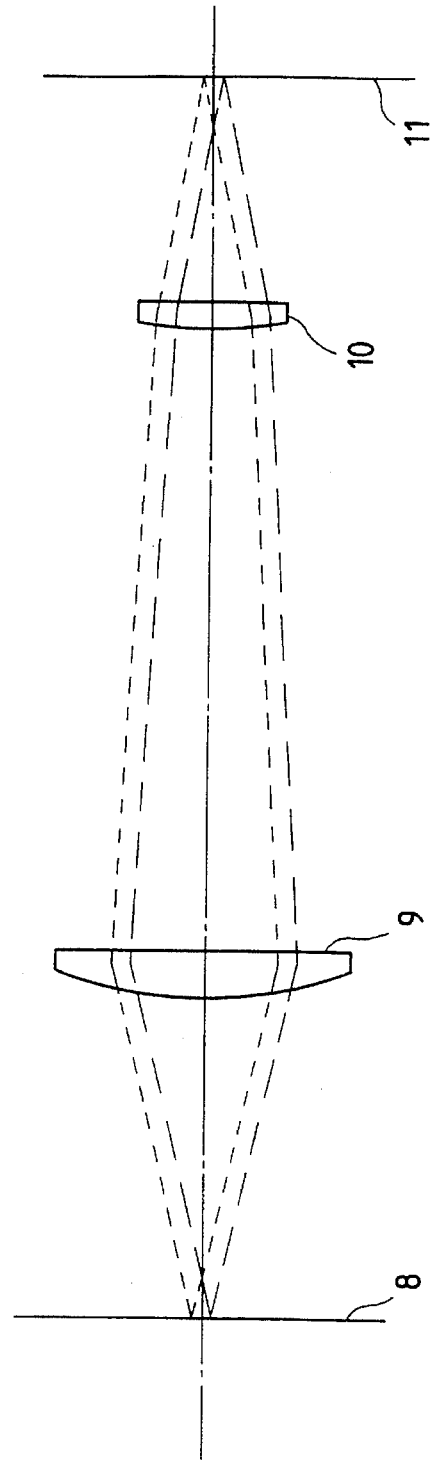
FIG. 12 is a development showing the optical system downstream of the polygon scanner of the information recording device of FIG. 10 as viewed in the plane, which is orthogonal to the plane of deflection and includes an optical axis.
Figure 13:
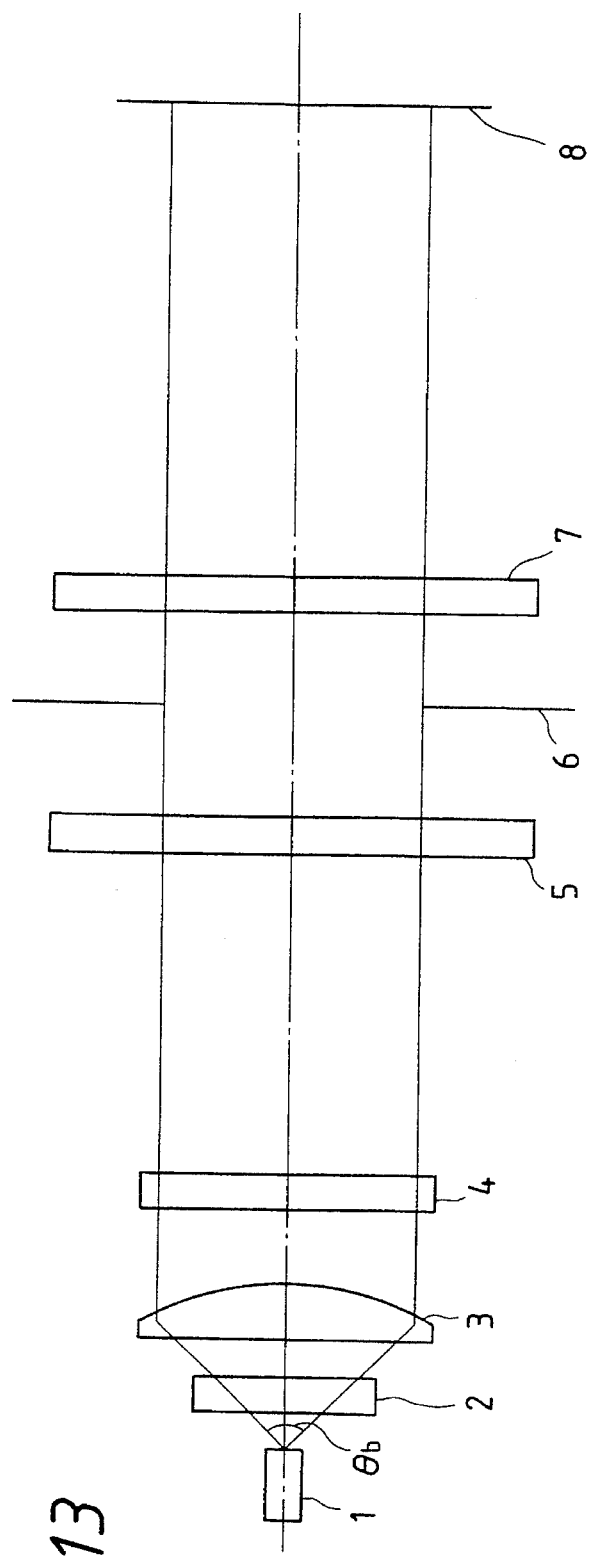
FIG. 13 is a development showing the optical system upstream of the polygon scanner of the information recording device of FIG. 10 as viewed in the plane, which is in parallel to the plane of deflection and includes an optical axis.
Figure 14:
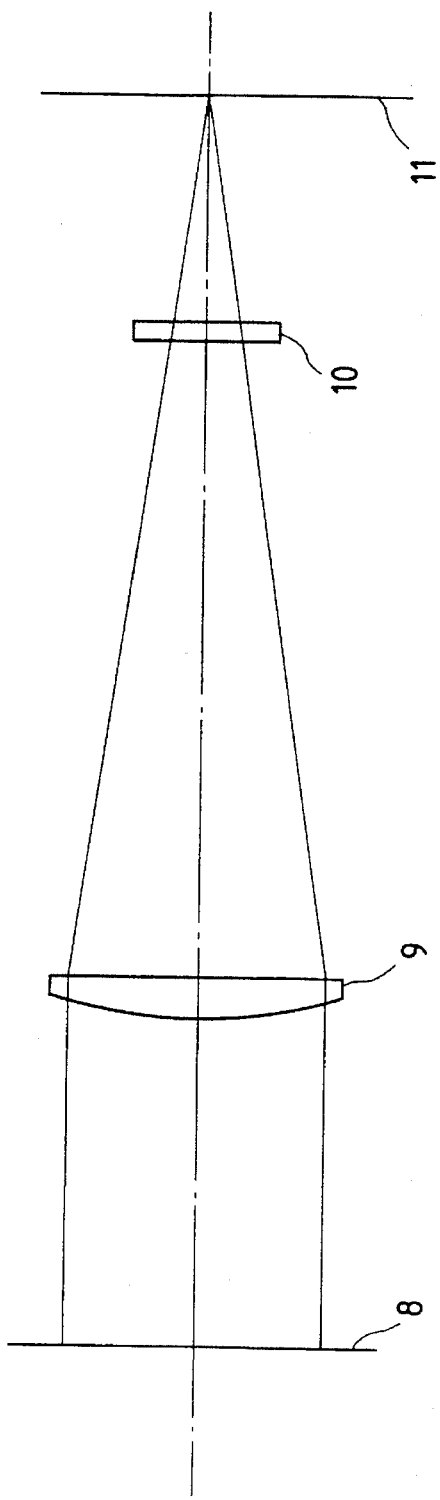
FIG. 14 is a development showing the optical system downstream of the polygon scanner of the information recording device of FIG. 10 as viewed in the plane, which is in parallel to the plane of deflection and includes an optical axis.

FIG. 10 is a perspective view showing the construction of an information recording device according to the first embodiment of the invention. FIGS. 11 and 12 are developments showing an optical system of the information recording device of FIG. 10 as viewed in the plane, which is orthogonal to the plane of deflection and includes an optical axis. FIGS. 13 and 14 are developments showing the optical system as viewed in the plane, which is in parallel to the plane of deflection and includes the optical axis.

A multibeam semiconductor laser array 1 is made up of two semiconductor laser elements 1a, spaced by 500 μm, which are arrayed on a single substrate and may be independently driven. Those laser elements 1a are packaged into a single unit. The laser elements 1a are arrayed in the direction orthogonal to the main scan direction, viz., in the subsidiary scan direction. The junction surface between the laser elements 1a extends in the direction parallel to the array direction of the laser elements 1a. The laser elements 1a are of AlGaInP type and are each capable of emitting a beam of laser light of 680 nm in wavelength. A divergence angle of laser light of each laser element is: $\theta_a = 12°$ with respect to the direction parallel to the junction surface between the laser elements 1a, and $\theta_b = 50°$ with respect to the direction vertical to the junction surface between the laser elements. The divergence angle, as described above, is defined as an angle to satisfy the power relation $1/e^2$.

Figure 15:
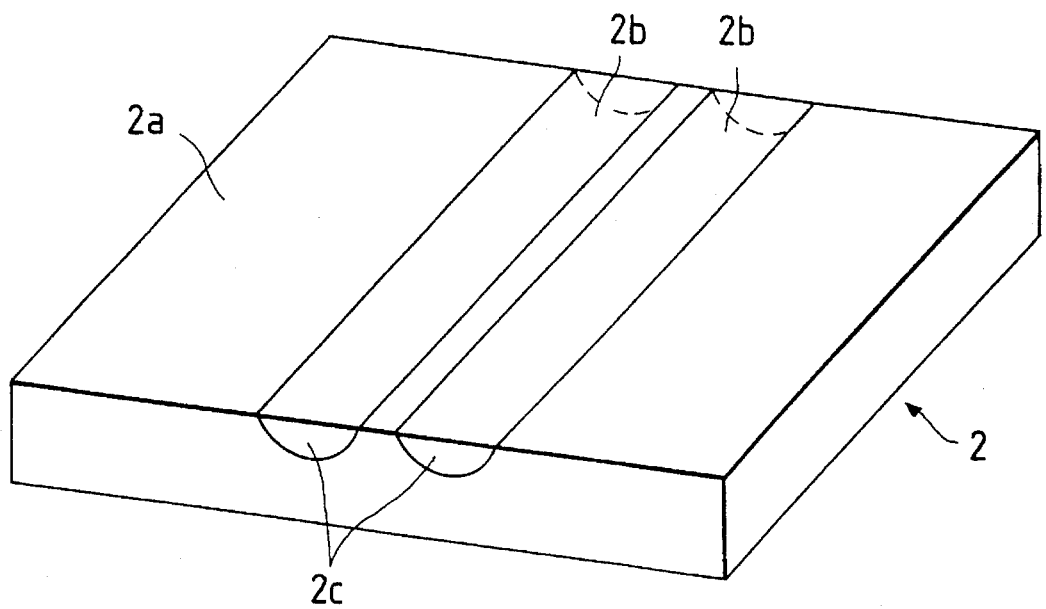
FIG. 15 is a perspective view showing a cylindrical lens array of the gradient index (GRIN) type, which is formed by diffusing ions into a glass substrate.

Laser light emitted from the multibeam semiconductor laser array 1 passes through a planer microlens array 2 and is collimated in the direction parallel to the junction surface between the laser elements (see FIG. 11). The microlens array 2 is a gradient index (GRIN) lens functioning as a cylindrical lens of the convex lens. In the plane parallel to the junction surface, the GRIN lens exhibits its lens function. An example of the construction of the microlens array 2 is shown in FIG. 15.

As shown, the microlens array 2 is constructed such that two cylindrical lenses 2b of the GRIN lens type are formed on the surface of a glass substrate 2a by diffusing thallium ions, for example. In the figure, reference numeral 2c indicates ion diffused regions. To form the diffused regions, a mask is formed over the glass substrate 2a by photolithography. The glass substrate 2a with the mask is immersed in fused salt containing thallium ions and the like, to diffuse thallium ions into the glass substrate. A portion of the glass substrate where a density of thallium ions is high exhibits a high refractive index. The cylindrical lenses 2b of the GRIN lens type are based on this nature. In addition, the method of manufacturing the planer microlens array 2 is well known. For the manufacturing method, reference is made to "N. Yamamoto and T. Yamasaki, National Convention Record of IEICE (Institute of Electronic Information and Communication Engineers), 1083 (1983)".

The microlens array 2 is specified as follows: focal distance is 2000 μm (2.0 mm), NA (numerical aperture) is approximately 0.1, and effective diameter of the lens as viewed in the direction in which it functions as a lens is approximately 400 μm (0.4 mm). This corresponds to a case where laser light is condensed to a place where its power is $1/e^2$ high as the power at the center of the laser beam, that is, a case where A=1.39 in equation (8). The distance between the two cylindrical lenses 2b is 500 μm, which is equal to the distance between the laser elements 1a.

Laser light leaving the microlens array 2 is collimated, by a cylindrical lens 3 as a convex lens, in the direction vertical to the junction surface between the laser elements 1a (see FIG. 13). Next, the laser light is expanded by a cylindrical lens 4 of a concave lens, and then is collimated again by a cylindrical lens 5. The collimated laser light is regulated by an optical stop 6, and is imaged on a mirror 8a of a polygon mirror 8 by a cylindrical lens 7 as a convex lens, only in the direction parallel to the junction surface of the laser elements 1a (see FIG. 11). The laser beams are parallel to each other in the direction vertical to the junction surface between the laser elements 1a. The laser light deflected by the polygon mirror 8 is focused on the surface of a photoreceptor 11 through an f-θ lens 9 and a cylindrical lens 10 as a convex lens. The cylindrical lenses 7 and 10 cooperate to form a so-called anamorphic optical system, which corrects the adverse effect by an inclination of the polygon mirror 8. The direction in which the polygon mirror 8 scans coincides with the main scan direction. In the present embodiment, the direction vertical to the junction surface between the laser elements 1a corresponds to the main scan direction. The direction 12 in which the photoreceptor 11 revolves coincides with the subsidiary scan direction, and corresponds to the direction parallel to the junction surface between the laser elements. Optical images $I_1$ and $I_2$ depicted on the photoreceptor 11 are developed by the general electrophotographic process, not shown.

Let us consider a laser beam printer of 800 spi (800 spots per inch) in resolution. The electrophotographic spot diameter is 32 μm (=25400 μm/800 lines), and hence the pitch in the subsidiary scan direction is also 32 μm. If the spot diameter correction coefficient "k"=1.5, the necessary optical spot diameter is 48 μm. The principal plane of the microlens array 2 and the surface of the photoreceptor 11 are disposed in an optically conjugate relationship. Since the pitch of the lenses of the microlens array 2 is converted into the pitch in the subsidiary scan direction, its lateral magnification β is: β=32 μm/500 μm=0.064 (≈1/16). The aperture of the optical stop 6 is selected so that the power of the laser light is ½ the power at the beam center in both the main and subsidiary scan directions. A quantity of the laser light is reduced to be half of that when the optical stop 6 is not used. When the optical stop 6 is not used, the optical spot diameter in the subsidiary scan direction of the imagery spot formed on the surface of the photoreceptor 11 is approximately 24 μm. According to the truncation effect, the optical spot diameter becomes 48 μm. The reason for this is that substituting equation (8) into equation (5), we have $d_3=A\beta D_1$, and by regulating the laser light to ½ in light quantity, A=1.97 and hence $d_3$ is also doubled. The diameter of the imagery spot on the surface of the photoreceptor 11 is approximately 24 μm long in the main scan direction.

A second embodiment of the information recording device according to the present invention will be described. The second embodiment is based on the interlaced scanning system.

Figure 19:
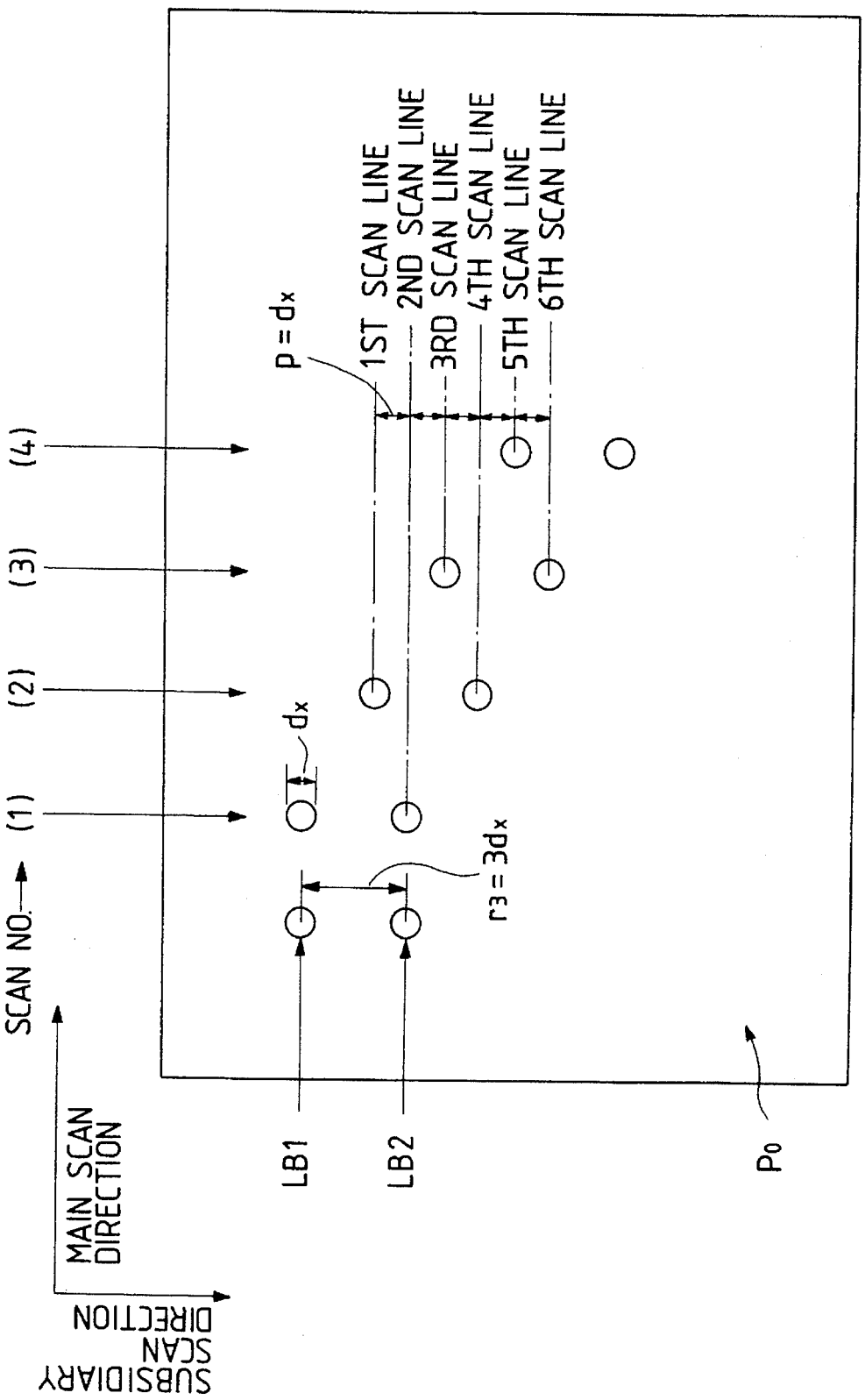
FIG. 19 is an explanatory diagram showing the principle of an interlaced scan in which a relationship between the imagery spots by laser beams on the image plane and scan lines are illustrated.
Figure 20:
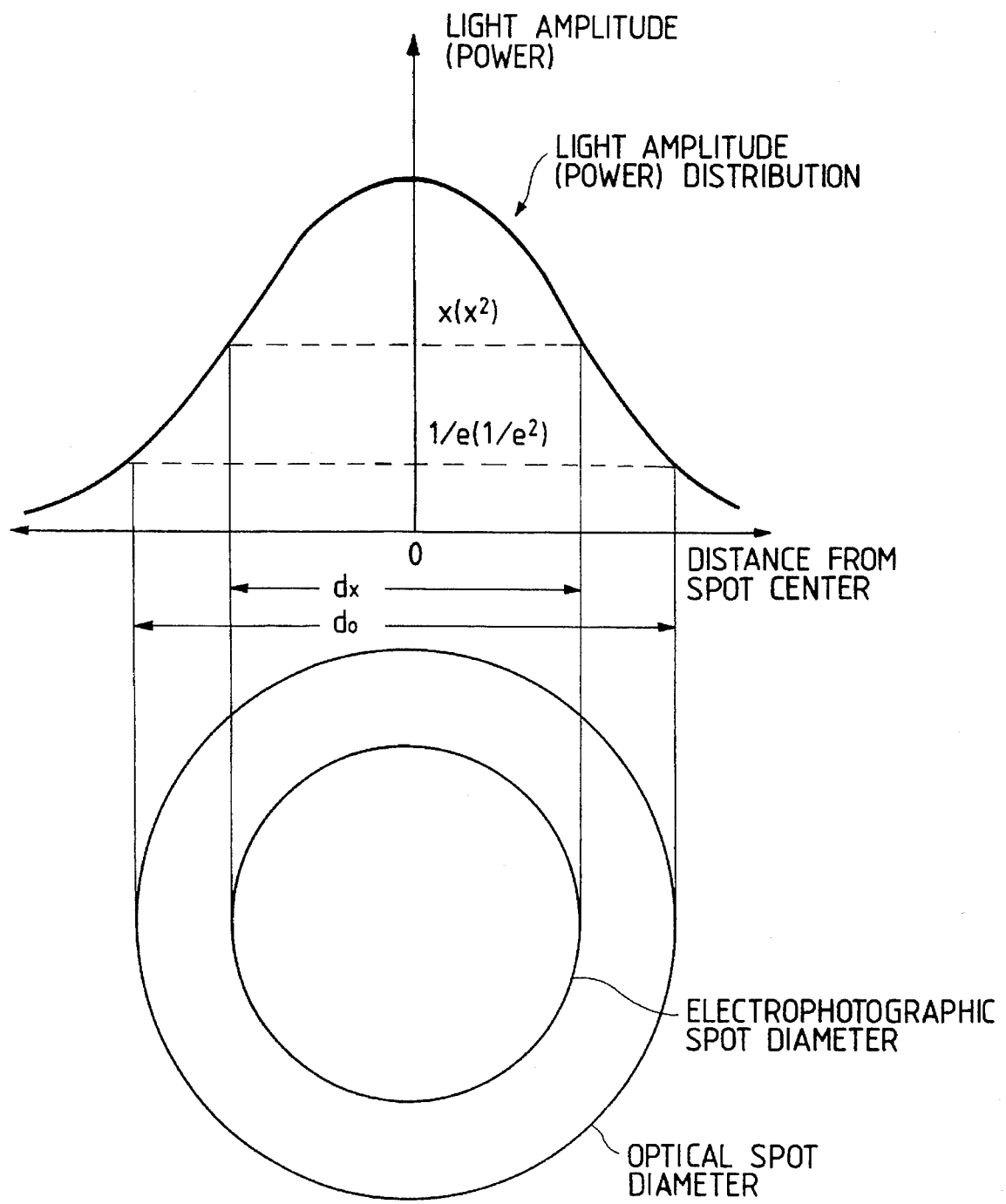
FIG. 20 is a graphical representation of a variation of light intensity of the imagery spot with respect to the distance from the center of the spot to the circumference.

In the construction shown in FIG. 10, some of the parameters of the optical system are altered and the interlaced scan shown in FIG. 19 is also used. The distance between the two laser elements 1a of the multibeam semiconductor laser array 1 is 1000 μm (1 mm), the distance between the two cylindrical lenses 2b of the microlens array 2 is also 1000 μm (1 mm), and the lateral magnification β=0.093 (≈1/11). The aperture of the optical stop 6 is set to be large, and the optical spot diameter is approximately 48 μm. Under this condition, the laser light passing through the microlens array 2 is straightforwardly imaged on the photoreceptor surface. Under this condition, the optical stop 6 functions only to remove stray light, and causes little loss of light. The remaining parameters are the same as those in the first embodiment.

With the above construction, the electrophotographic spot diameter of the imagery spot formed on the surface of the photoreceptor 11 is approximately 32 μm long in the subsidiary scan direction, and the distance of the two imagery spots is approximately 96 μm. Therefore, the requirements for the interlaced scan in FIG. 19 are satisfied.

Figure 16:
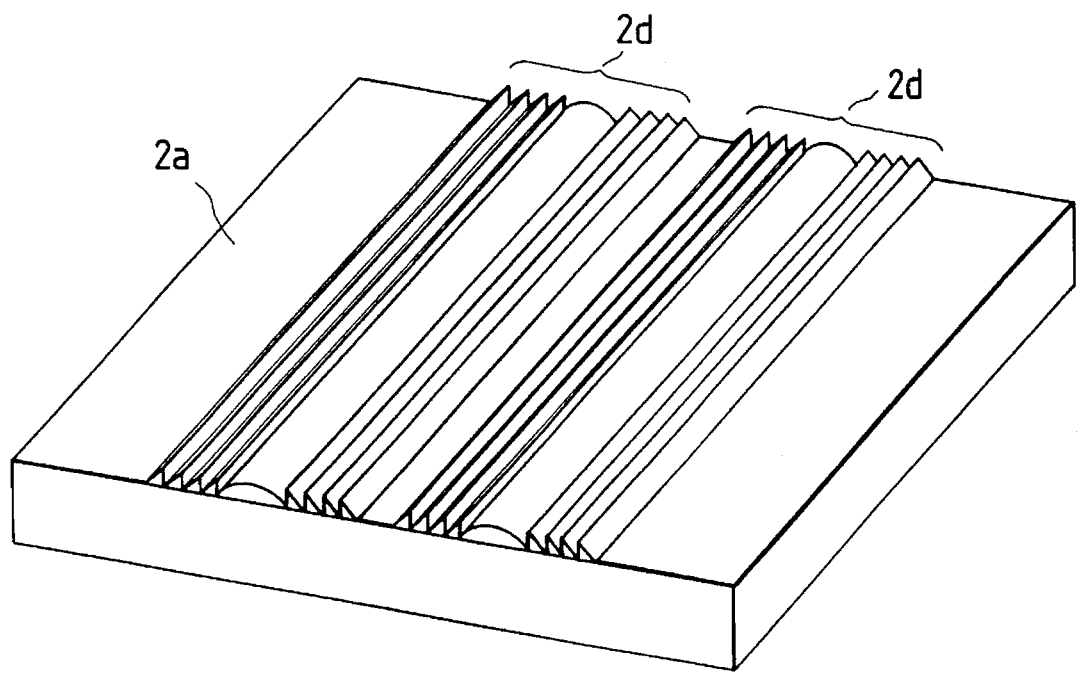
FIG. 16 is a perspective view showing a cylindrical lens array of the Fresnel lens type, which is formed on a glass substrate.

The embodiment shown in FIG. 10 uses the plane microlens array 2 constructed with the cylindrical lenses of the GRIN type that are formed by an ion diffusion process. In place of the microlens array, a cylindrical lens array as shown in FIG. 16 may be used. In the cylindrical lens array, a pair of cylindrical lenses 2d of the Fresnel lens type are formed on a glass substrate 2a by electron beam lithography. The micro-Fresnel lens for the collimator of the semiconductor laser device may be manufactured by using the technique as described in "Low Aberration Visible Micro-Collimated Laser Diode", by M. Yoneda et al., The 1990 IEICE (Institute of Electronics•Information and Communication Engineers) Spring National Convention Record, C-265 (1990).

Figure 17:
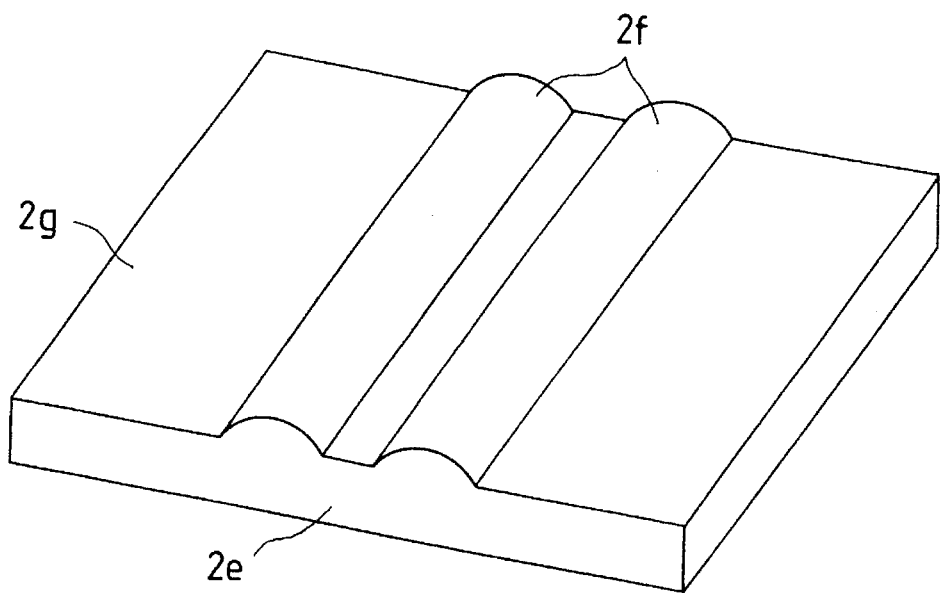
FIG. 17 is a perspective view showing a cylindrical lens array made of glass or plastic, which is formed by an injection molding method.

Further, the microlens array 2 used in the embodiment of FIG. 10 may be replaced by a cylindrical lens array 2g as shown in FIG. 17. In the cylindrical lens array, a pair of cylindrical lenses 2f are formed by injection molding a transparent material 2e of plastic or glass.

The interlaced scanning system may be used for the cases where the cylindrical lens array shown in FIG. 16 and the injection molded cylindrical lens array shown in FIG. 17 are used in place of the microlens array 2 of FIG. 10.

Figure 18:
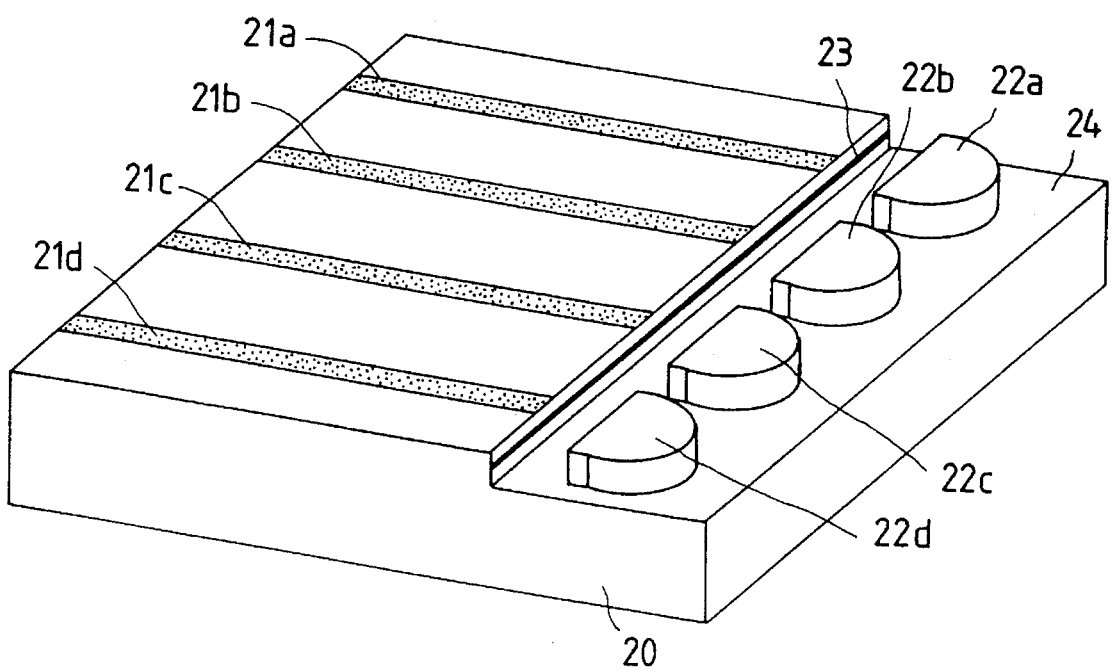
FIG. 18 is a perspective view showing a multibeam semiconductor laser array in which a laser array and a microlens array are fabricated into a single piece.

A multibeam semiconductor laser array as shown in FIG. 18 in which a laser array and a microlens array are fabricated into a single unit may be substituted for the combination of the multibeam semiconductor laser array 1 and the microlens array 2 in FIG. 10. In the multibeam semiconductor array of FIG. 18, cylindrical lenses 22a to 22d are respectively disposed in connection with semiconductor laser elements 21a to 21d. The cylindrical lenses 22a to 22d are formed in a manner that a substrate 20 made of AlGaAs or AlGaInP are worked into lenses by dry-etching process. The structure of the semiconductor laser array and the method of manufacturing the same are known, and for the details of them, reference is made to "Laser Diode Integrated with Microlens (II)" by J. Shimada and O. Ohguchi, in The 1991 IEICE (Institute of Electronics•Information and Communication Engineers) Spring National Convention Record, C-251 (1991). SiO$_2$, plastics or the like may also be used for the cylindrical lenses 22a to 22d. When using any of those materials, the end face 23 of the multibeam semiconductor laser array and the terrace 24 are formed by a dry-etching process. A film made of a material, such as SiO$_2$, plastics or the like, is formed thereover by a suitable method, such as sputtering or casting process, and then is selectively etched away to form the cylindrical lenses 22a to 22d.

Thus, the semiconductor laser elements 21a to 21d and the cylindrical lenses 22a to 22d respectively associated therewith are formed on the single substrate in an integral form. Therefore, the number of steps to assemble the information recording device is reduced, thereby to provide an easy manufacturing of the recording device. Additionally, there is no need for optically aligning the multibeam semiconductor laser array with the microlens array. The number of steps for the related adjustment is reduced.

Where the interlaced scan as mentioned above is employed, a high mechanical precision is required for the scan optical system, because the spot-to-spot distance on the image plane is relatively wide. The construction of FIG. 18 is suitable for the interlaced scan, because it provides the improved position precision of the laser elements with respect to the cylindrical lenses.

The information recording devices according to the embodiments thus far made are based on the electrophotographic process; however, if required, the present invention may be applied to a recording system that is based on any of other processes than the electrophotographic process. The present invention may be applied to a recording system in which a photosensitive film, not the electrophotographic photoreceptor, is scanned, a thermal recording system based on the thermal effect of the laser beams, an opto-magnetic recording system, and the like. In those recording systems, the optimum value of "k" in equation (1) is not always equal to that in the recording system based on the electrophotographic process. Therefore, the distance of the adjacent laser light sources must be empirically determined depending on the recording process used.

The present invention may also be applied to an information recording or storage system, such as a multitrack recording system in an optical memory.

Next, an optical disk device to which the present invention is applied, as another embodiment, will be described hereinafter.

Figure 21A:
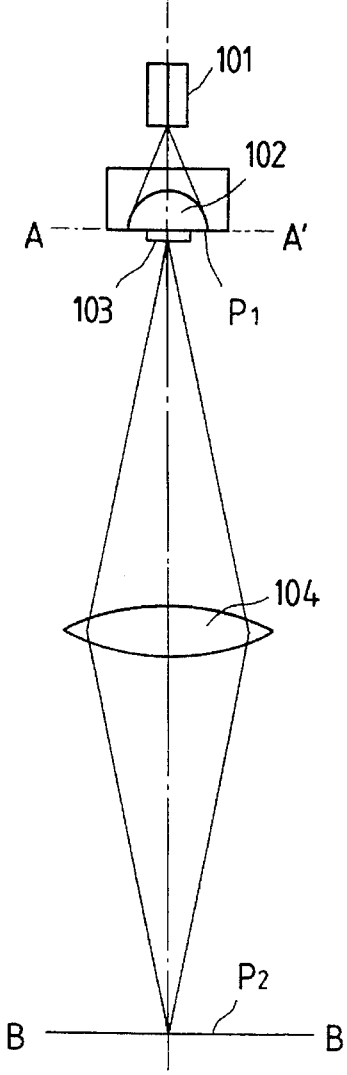
FIG. 21(a) is a view showing the basic construction of another embodiment of the present invention.

FIG. 21(a) is a view showing the basic construction of this embodiment. A laser beam from a laser light source 101 is arranged into a parallel light beam by a collimator lens 102. The collimator lens 102 is a planar microlens of the distributed refractive index type, that is formed by ion diffusion process. A phase shifter 103 as phase modulating means is provided at the central part of the collimator lens 102. The phase shifter 103 consists of a thin film that is made of SiO$_2$, Si$_3$N$_4$ or the like and of λ/2n thick where λ denotes the wavelength of a laser beam, and n denotes the refractive index of the thin film.

Figure 21B:
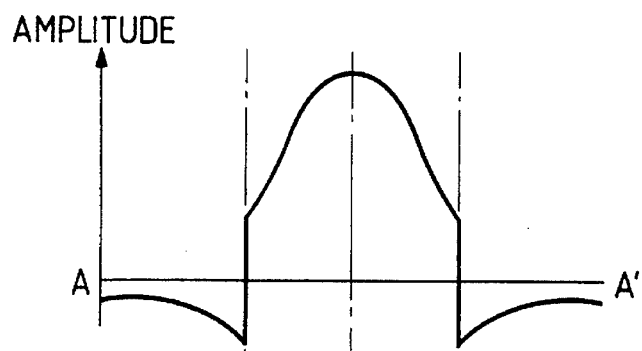
FIG. 21(b) is a graphical representation of a variation of the amplitude of laser beam over line A-A' in FIG. 21(a)
Figure 21C:
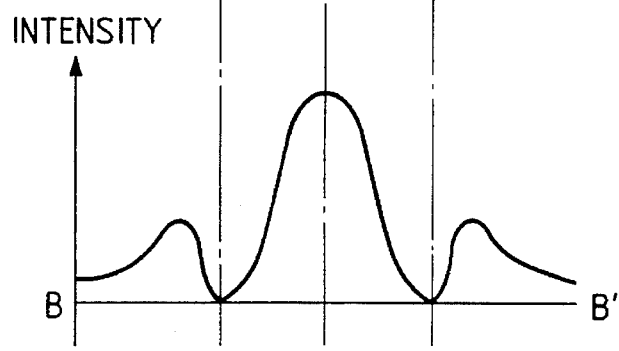
FIG. 21(c) is a graphical representation of a variation of the intensity of laser beam over line B-B' in FIG. 21(a)

With use of the phase shifter 103, there is caused an optical path difference of λ/2 between the light beam passing through the central part of the collimator lens 102 and the light beam passing through the peripheral part of the collimator lens. FIG. 21(b) is a graphical representation of a variation of the amplitude of laser light over line A-A' in FIG. 21(a). A plane P1 of the collimator lens 102 with the phase shifter 103 formed thereon is optically conjugate to an image forming plane P2 with respect to an image forming lens 104. In other words, an image on the plane P1 is projected on the plane P2. FIG. 21(c) is a graphical representation of a profile of a light spot formed on the image forming plane P2.

The amplitude variations of the light inside and outside the phase shifter 103 are out of phase with respect to the peripheral edge of the phase shifter 103. Therefore, when an image on the plane P1 is formed on the image forming plane P2, which is conjugate to the plane P1, the intensity of light at the peripheral edge of the phase shifter 103 is substantially zero (0). As a result, the profile of the light beam spot is narrow in shape. Thus, the beam spot formed by the optical system including the phase shifter 103 is narrower than that by the optical system not including the phase shifter, while at the same time a side lobe appears. The beneficial effects of the optical system above described can be achieved by causing a phase difference between the light beam passing through the central part and the light beam passing through the peripheral part by some means.

Figure 22A:
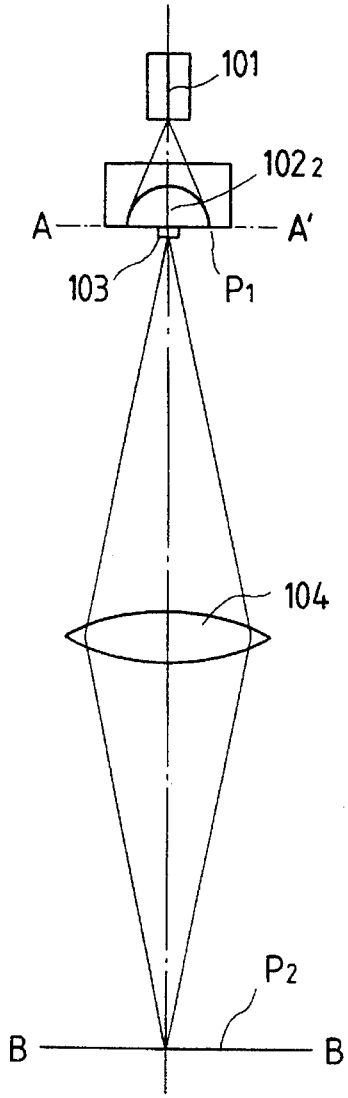
FIG. 22(a) is a view showing a modification of the system of FIG. 21(a)
Figure 22B:
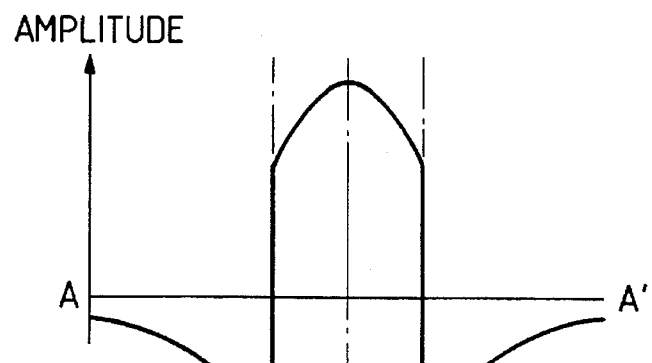
FIG. 22(b) is a graphical representation of a variation of the amplitude of laser beam over line A-A' in FIG. 22(a)

A modification of the system of FIG. 21(a) is shown in FIG. 22(a). In this optical system, the diameter (e.g., 0.1 mm) of the phase shifter 103 is smaller than that (e.g., 0.2 mm) of the phase shifter 103 in the optical system of FIG. 21(a). With the reduction of the phase shifter diameter, the diameter of the beam spot formed can be further reduced. The amplitude of light varies on the plane P1 as shown in FIG. 22(b). The intensity of light is profiled on the image forming plane P2 as shown in FIG. 22(c).

Figure 23A:
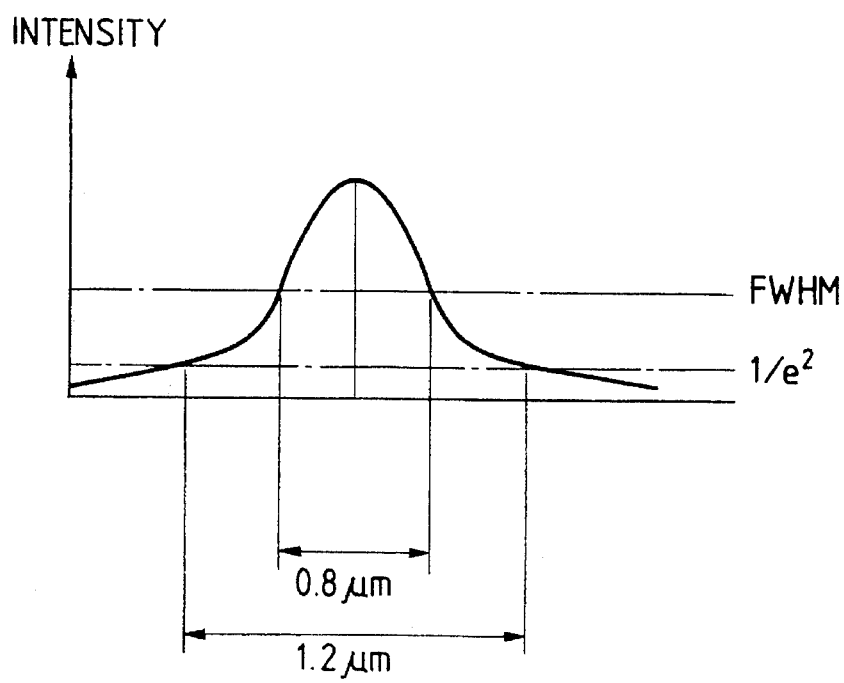
FIG. 23(a) is a graphical representation of a variation of the intensity of a laser beam spot over the image forming surface in a normal image forming optical system.
Figure 23B:
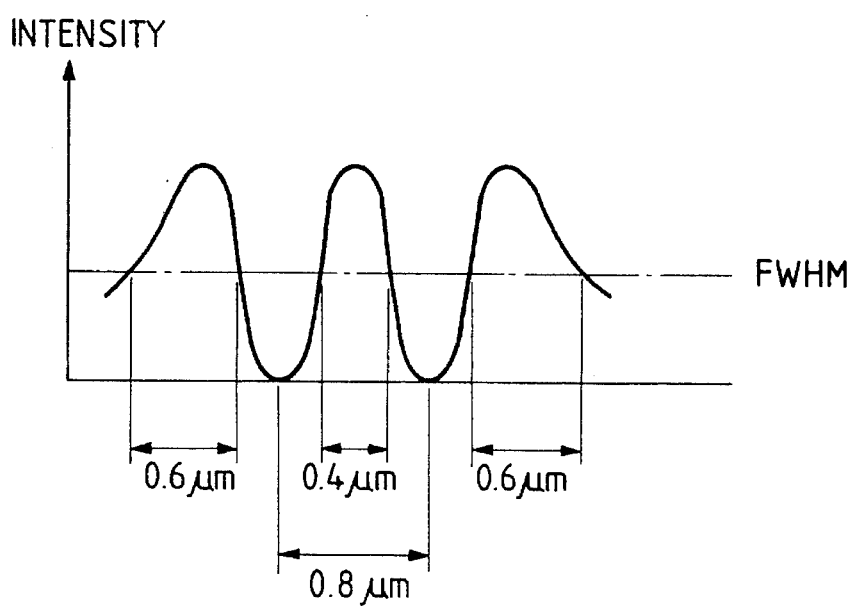
FIG. 23(b) is a graphical representation of a variation of the intensity of a laser beam spot over the image forming surface in the optical system of FIG. 22(a)

A specific example of the profile of the laser spot formed by the optical system of FIG. 22(a) is shown in FIG. 23(b). A profile shown in FIG. 23(a) is formed by an optical system of the same type, which does not include the phase shifter 103. In the figures, FWHM indicates a level defining the Full Width at Half Mean. 1/e$^2$ indicates a level defining the diameter of the Gaussian beam profile. In the optical system using the phase shifter 103, the diameter (0.4 μm) of the main peak at the central part is half of the diameter (0.8 μm) in the optical system not using the phase shifter 103. However, a large side lobe, shaped like a doughnut, surrounds the main peak. A light diminishing means may be used in combination with the phase shifter 103. In this case, there is no need of reducing the diameter of the phase shifter 103.

In the optical systems of FIGS. 21(a) and 22(a), the surface of the collimator lens 102 having the phase shifter 103 formed thereon is directed toward the image forming lens 104. If required, it may be directed toward the laser light source 101. The intended object when the phase shifter is used can be achieved by placing the phase shifter 103 close to the principal plane of the collimator lens 102. In a case where the thickness of the glass substrate of the collimator lens 102 cannot be reduced, it is preferable to direct the phase-shifter bearing surface of the collimator lens 102 toward the laser light source 101 to gain an easy assembling of the actual optical system. If the collimator lens 102 has a thick glass substrate, the focal point of the collimator lens 102 is positioned within the glass substrate.

Figure 22C:
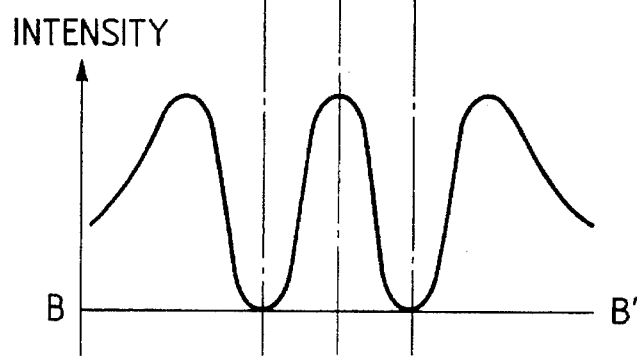
FIG. 22(c) is a graphical representation of a variation of the intensity of laser beam over line B-B' in FIG. 22(a)

In the present embodiment, data is written using the laser spot profiled as shown in FIG. 21(c), and is read out using the laser spot profiled as shown in FIG. 22(c). If the size of the phase shifter 103 is properly selected, the diameter of the formed spot can be reduced by approximately 20%, with a relatively small side lobe formed. The combination of the formed spot and the laser power control enables a small pit to be recorded. For reading out data, the laser beam spot as shown in FIG. 22(c) is used, and the side lobe is removed by an aperture.

Figure 24:
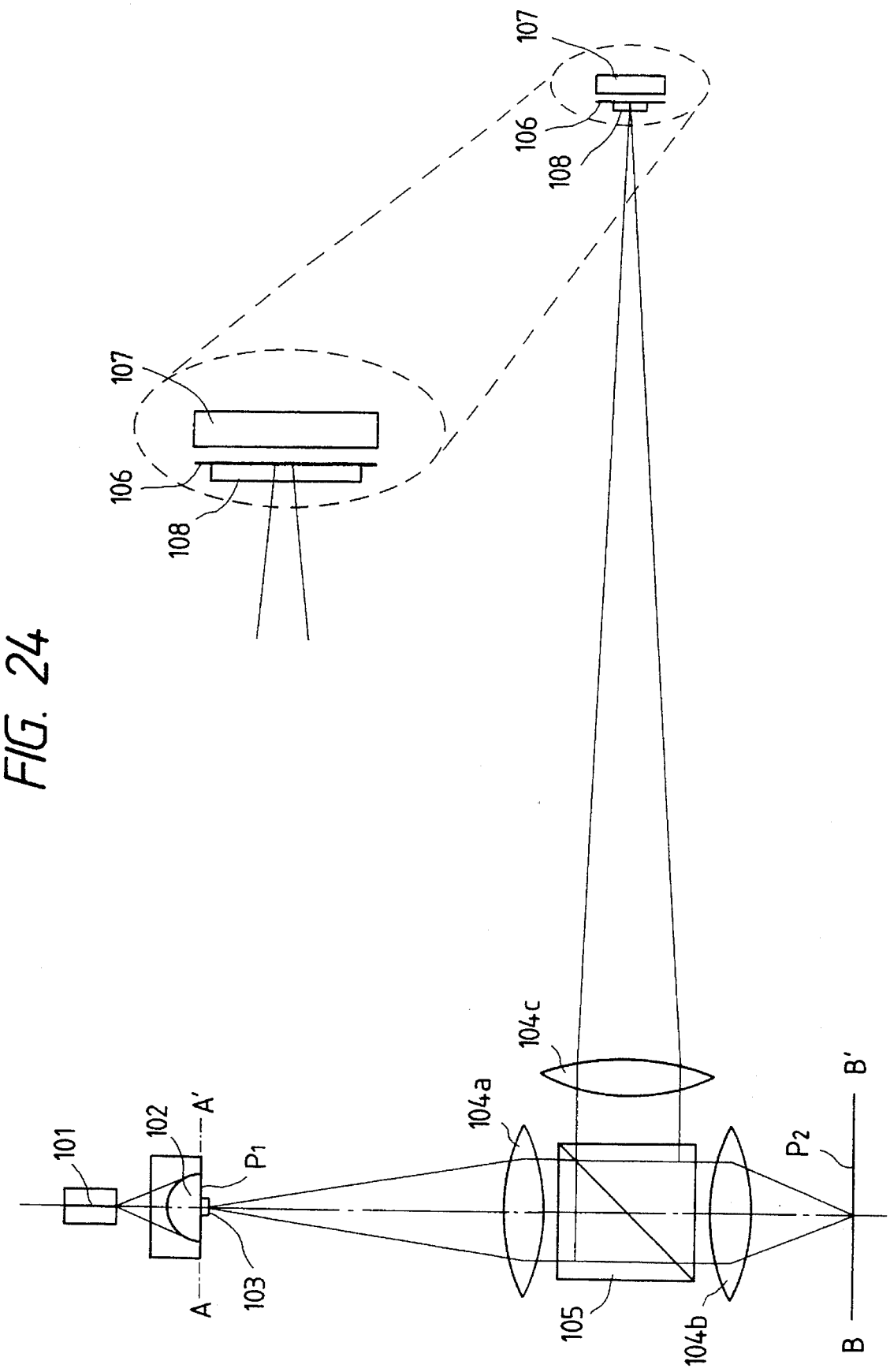
FIG. 24 is a view showing a data reading system in an optical disk device incorporating the present invention, the data reading system being developed along a plane including the optical axis.

FIG. 24 shows a schematic illustration of an optical disk device which allows high resolution data reading, using a laser beam spot as shown in FIG. 22. In the figure, like reference numerals are used for designating like or equivalent portions in the optical system of FIG. 21(a) and FIG. 22(a).

A laser beam emitted from the laser light source 101 is arranged into a parallel light beam when considered from the standpoint of geometric optics. The phase shifter 103 causes the optical path difference of λ/2 between the light beam passing through the central part of the collimator lens 102 and the light beam passing through the peripheral part of the lens. The light beam emanating from the collimator lens 102 is collimated by a collimator lens 104a, passes through a beam splitter 105, and is focused on the image forming plane P2 by means of an image forming lens 104b.

In a record mode, the phase shifter 103 of the large diameter shown in FIG. 21(a) is used. The Full Width at Half Maximum (FWHM) of the beam spot on the image forming plane P2 is approximately 0.8 µm as shown in FIG. 23(a). The diameter of a pit to be actually written into the optical disk is approximately 0.4 µm.

In a reproduction mode, the phase shifter 103 of the small diameter shown in FIG. 22(a) is used. The FWHM of the beam spot on the image forming plane P2 is approximately 0.4 µm as shown in FIG. 23(b). Recorded data can be read out with the width of 0.4 µm. Since the doughnut-like side lobe is present around the main peak, the reproduced data includes not only the intended recorded data but also the recorded data preceding and subsequent to the intended data and data recorded in the adjacent tracks. To remove the side lobe, an aperture is coupled with the light sensing portion as described below.

The light beam reflected from the recording medium passes through the image forming lens 104b, is bent in its path by 90° by the beam splitter 105, passes through an image forming lens 104c and an aperture 106, and reaches the light sensing surface of a light sensing element 107. The aperture 106 is located at a position optically conjugate to the recording (image forming) plane P2. The focal distance of the image forming lens 104c is approximately 100 times that of the image forming lens 104b. Accordingly, an image on the image forming plane P2 is magnified 100 times and formed on the aperture 106. For simplicity of illustration, the distances are not exact in the optical system shown in FIG. 24. In a case where the recording medium is of the magneto-optical type, a polarizer 108 is disposed in front of the aperture 106.

The principle of a reading operation in the optical disk device constructed as shown in FIG. 24 is diagrammatically illustrated in FIG. 25.

Figure 25A:
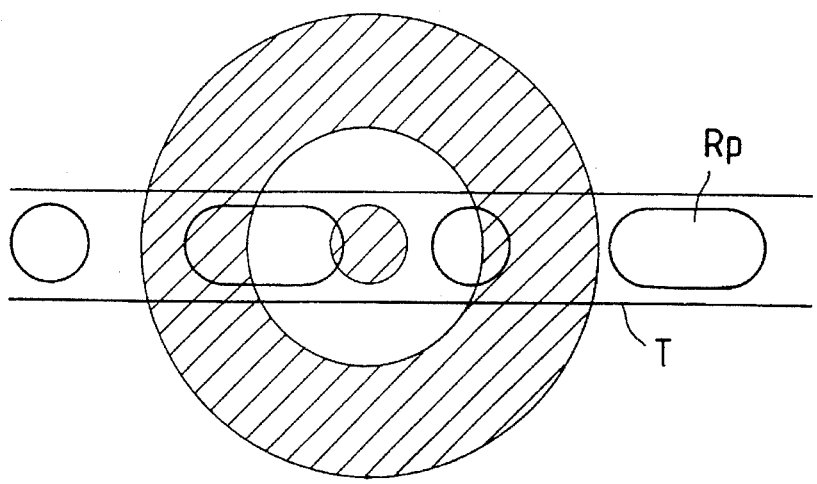
FIG. 25(a) is a view showing the relationship of a record pit formed in a track of a recording medium and a reading beam spot.
Figure 25B:
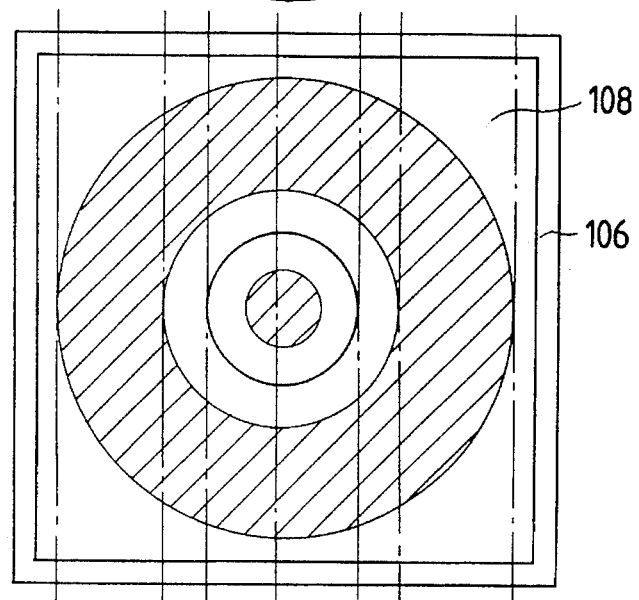
FIG. 25(b) is a view showing the positional relationship between an aperture and the reading beam reflected from the recording medium.
Figure 25C:
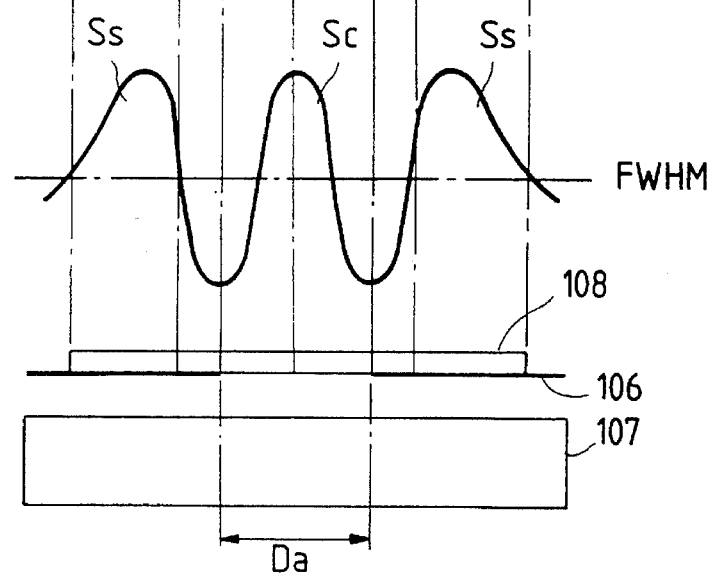
FIG. 25(c) is a view showing a profile of the read beam across the aperture.
Figure 25D:
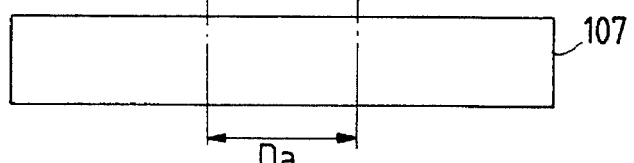
FIG. 25(d) is a cross sectional view of the combination of a polarizer, aperture and light sensing element.

Record pits Rp formed in the track T on the recording medium and a reading beam are illustrated in FIG. 25(a). The width of the main peak Sc of the reading beam (see FIG. 25(c)) is selected to be substantially equal to that of the record pit Rp. In FIG. 25(a), shaded portions are the areas of the reading beam where the light intensity is in excess of the FWHM level. The positional relationship of the aperture 106 and the reading beam reflected from the recording medium is shown in FIG. 25(b). The profile of the reading beam at the aperture 106 is shown in FIG. 25(c). The cross section of the combination of the polarizer 108, aperture 106 and the light sensing element 107 is shown in FIG. 25(d).

The light beam reflected from the recording medium is imaged on the aperture 106 at the magnification of 100 times. The diameter Da of the aperture 106 is 80 µm in this instance. The value of 80 µm is equal to the distance 100 times (corresponding to the optical magnification) the width of 0.8 µm of the profile at the level of zero shown in FIG. 23(b), which extends to both sides of the central peak.

The side lobe Ss of the reading beam is interrupted by the aperture 106, and only the main peak Sc is allowed to pass through the aperture 106. Therefore, a small record pit Rp can be read, and hence data can be recorded at a high recording density and the data thus recorded can be read out.

Thus, after the reflected light beam from the recording medium is magnified, the side lobe is removed by the aperture 106. Accordingly, the diameter of the opening of the aperture 106 can be selected to be large, approximately 80 µm.

In the optical disk device of FIG. 24, the polarizer 108 is disposed in proximity with the aperture 106. It is required when the recording medium is of the magneto-optical type, but is not required for the recording medium of the phase-change type or the read-only type.

An optical disk device using multiple laser beams, to which the high-density recording/reproducing technique as mentioned above is applied, will be described hereinafter.

Figure 26:
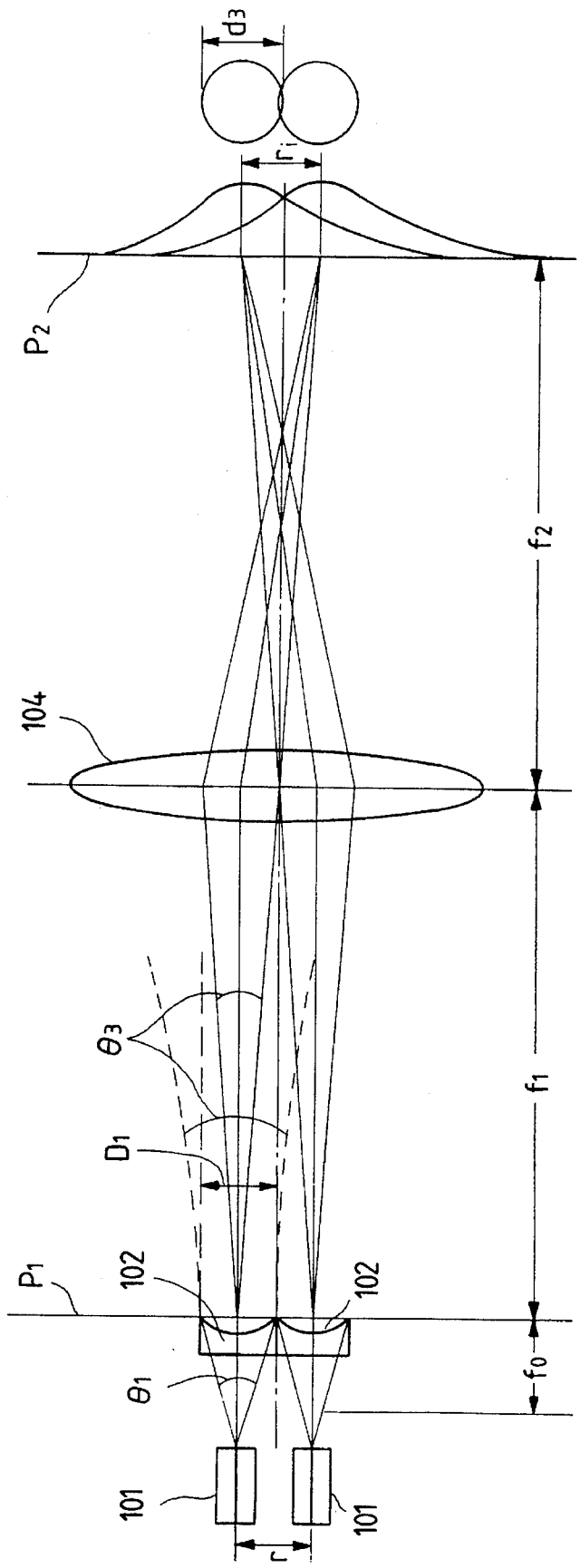
FIG. 26 is a view showing the basic construction of a multibeam optical disk device.

The basic construction of the multibeam optical disk device is shown in FIG. 26. Two collimator lenses 102 having the focal distance f0 are provided for laser light sources 101 and 101 in one-to-one correspondence manner. The laser beam emitted from the laser light source 101 is arranged into a parallel light beam by means of the collimator lens 102 when considered from the standpoint of geometric optics. However, when considered from the standpoint of wave optics, it has a divergence angle $\theta_3$. The divergence angle $\theta_3$ is smaller than the divergence angle $\theta_1$ of the laser beam emitted from the laser light source 101. The laser beam is focused on the image forming plane P2 by means of the image forming lens 104, thereby forming a beam spot thereon. In the FIG., $f_1$ indicates the distance between the plane P1 of the collimator lens 102 and the image forming lens 104, $f_2$ indicates the distance between the image forming lens 104 and the image forming plane P2.

When the divergence angle of the laser light is decreased, the beam spot diameter $d_3$ increases while the spot-to-spot distance $r_i$ on the image forming plane P2 remains unchanged. This fact implies that where the distance $r_i$ between the laser light sources 101 and 101 is large, the spot-to-spot distance $r_i$ on the image forming plane P2 can be substantially reduced by adjusting the magnification in the optical system, if the divergence angle is small.

Figure 27A:
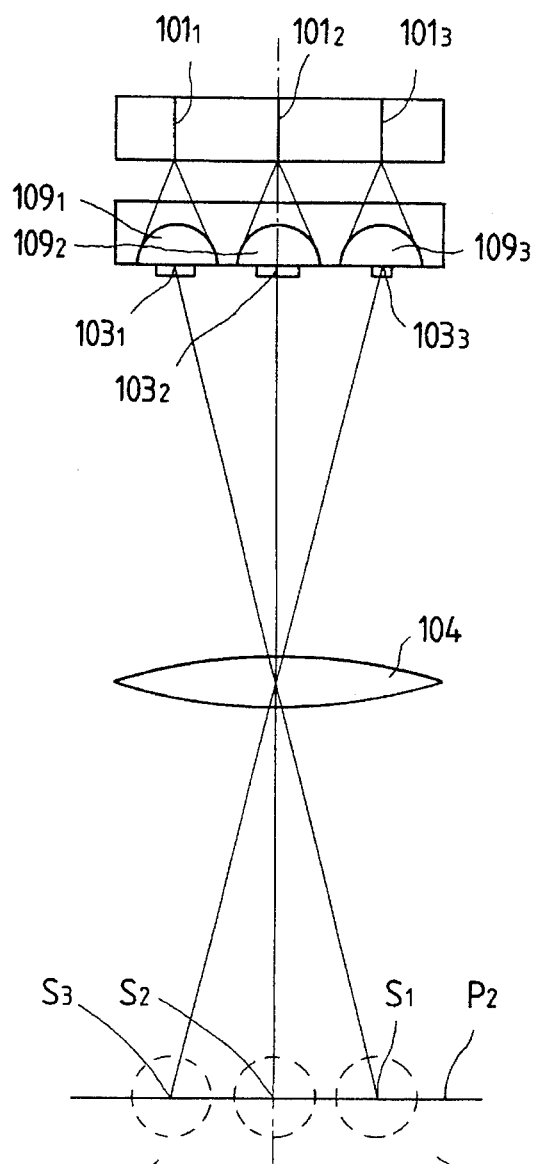
FIGS. 27(a) through 27(c) are views showing a case where the present invention is applied to the multibeam optical disk device of FIG. 26.
Figure 27B:
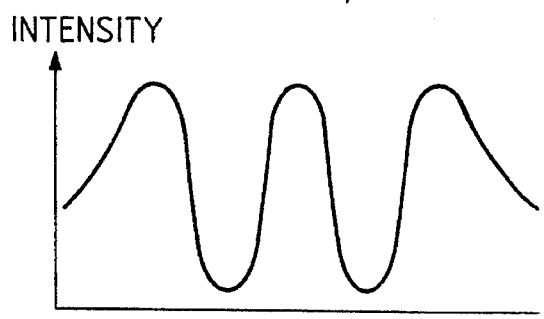
Figure 27C:
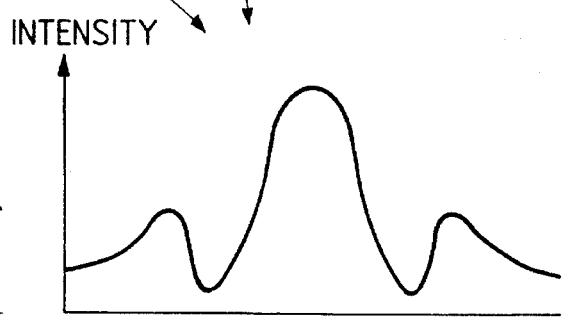

A schematic illustration of a multibeam optical disk device of FIG. 26 to which the present invention is applied is shown in FIG. 27. Laser beams emitted from laser sources $101_1$ to $101_3$ pass through planar microlenses $109_1$ to $109_3$ as collimator lenses and phase shifters $103_1$ to $103_3$, and are imaged with spots $S_1$ to $S_3$ on the image forming (recording) plane P2 by means of the image forming lens 104. The plane P1 of the planar microlenses $109_1$ to $109_3$ having phase shifters $103_1$ to $103_3$ formed thereon is optically conjugate to the image forming plane P2 with respect to the lens 104. The formed spots $S_1$ and $S_2$ have profiles as shown in FIG. 27(c) (corresponding to FIG. 21(c)). The spot $S_3$ has a profile as shown in FIG. 27(b) (corresponding to FIG. 22(c)). Of those spots $S_1$ to $S_3$ formed on the same track, the spot $S_3$ is used for the read operation, the $S_2$ for the erasure operation, and the spot $S_1$ for the write operation.

Figure 28:
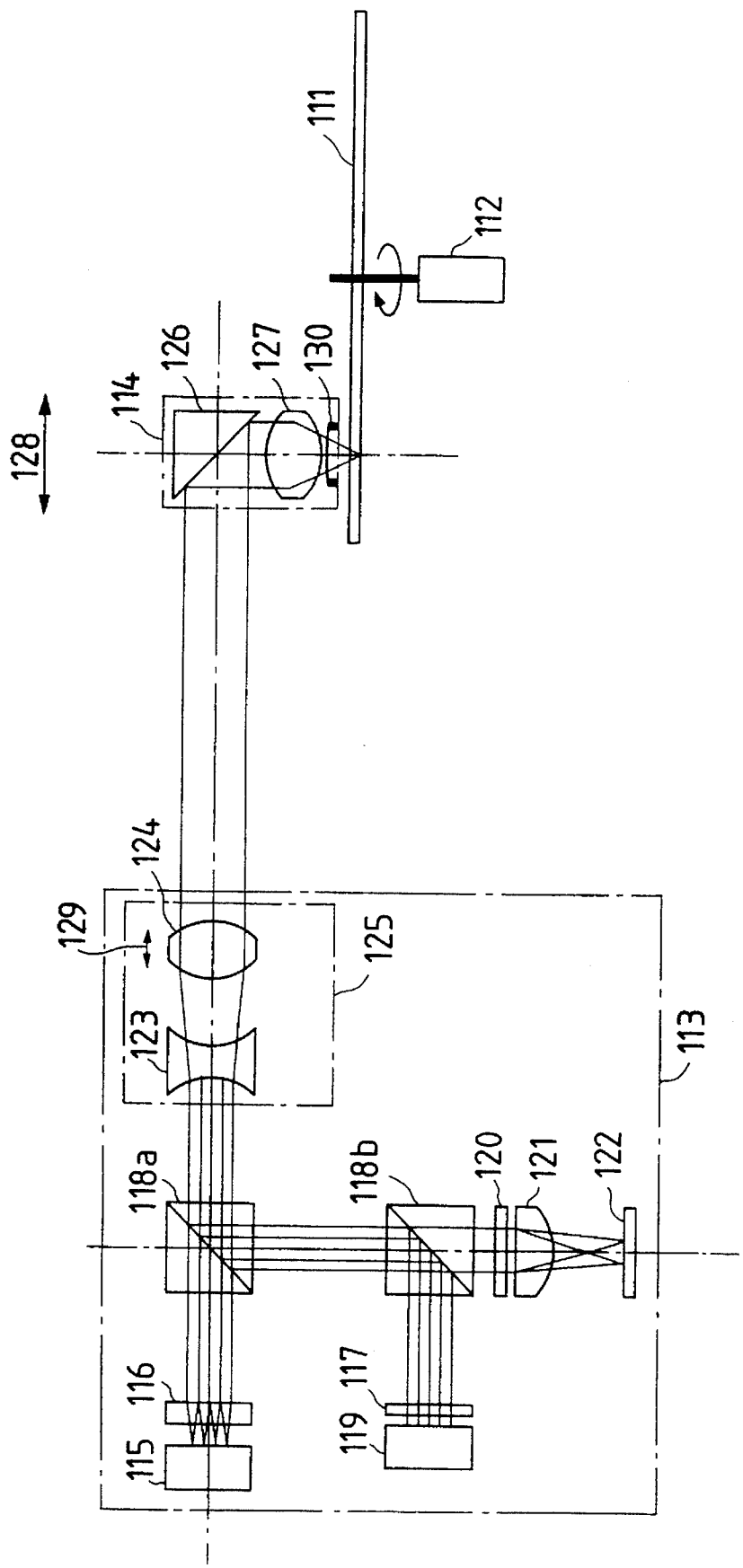
FIG. 28 is a view showing an optical system of the optical disk device according to the embodiment of the present invention, the optical system being developed along a plane including the optical axis.

The optical system of the multibeam optical disk device shown in FIG. 27 is schematically illustrated in FIG. 28. An optical disk 111 is rotated at a constant speed by a motor 112. An optical head consists of an optical head fixed portion 113 and an optical head movable portion 114. Within the optical head fixed portion 113 a semiconductor laser array 115 as a light source is disposed which is a two-dimensional array of semiconductor laser elements of the surface emission type. Laser beams emitted from the two-dimensional semiconductor laser array 115 are collimated by a micro-collimator lens array 116.

Figure 29:
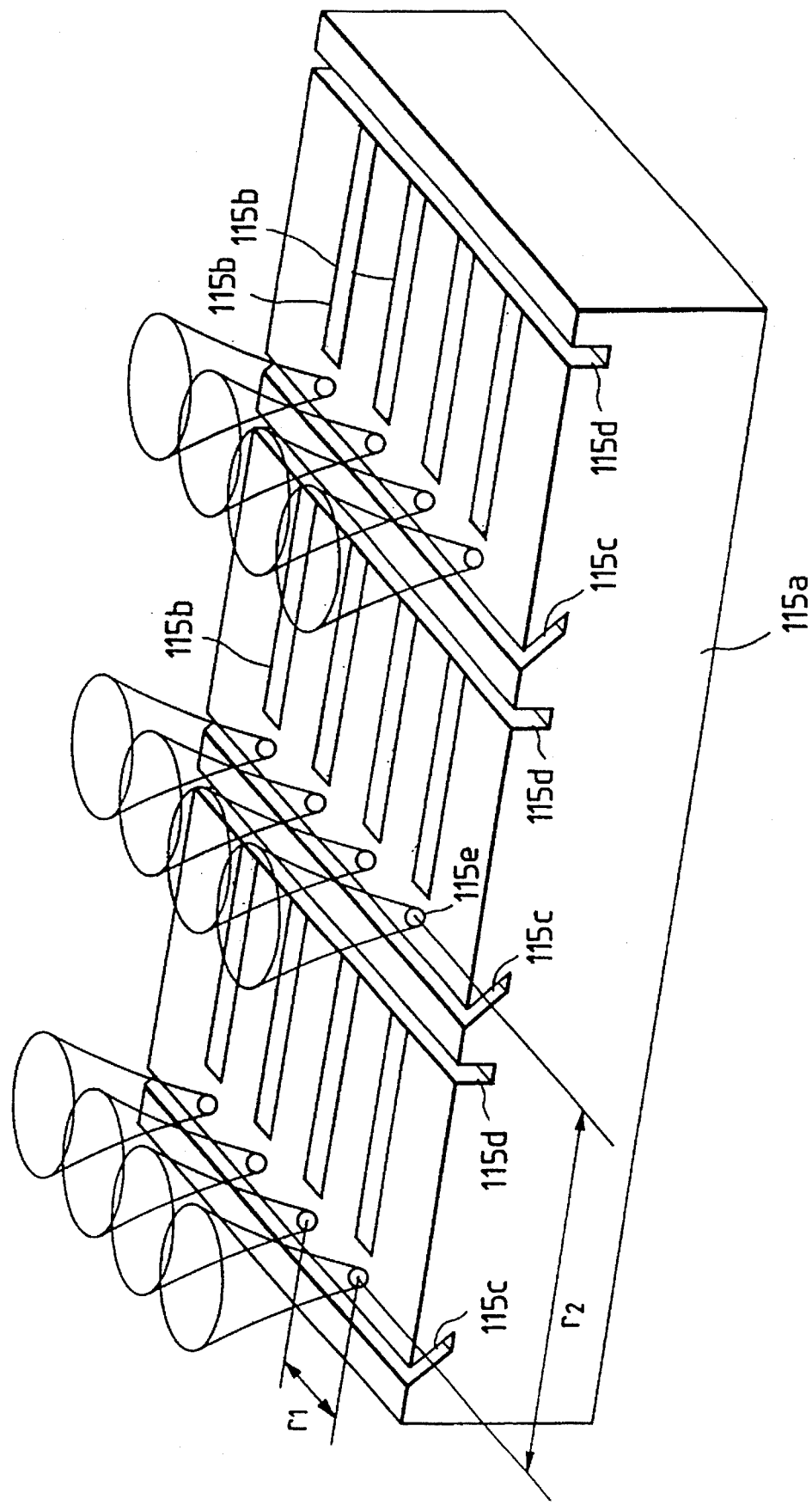
FIG. 29 is a perspective view showing the construction of a semiconductor laser array used in the optical disk device of FIG. 28.

FIG. 29 is a perspective view showing the construction of the two-dimensional semiconductor laser array 115 used in the optical disk device of FIG. 28. As shown, a plurality of semiconductor laser elements 115b are arrayed in a matrix fashion on a substrate 115a made of GaAs, for example. One side of each column of semiconductor laser elements 115b is grooved in the column direction. The groove, which is slanted at 45° to the substrate surface as viewed in cross section, has an end surface 115c. The other side of each column of the semiconductor laser elements is also grooved in the column direction. The groove, which is vertical to the substrate surface as viewed in cross section, has an end surface 115d serving as a mirror face. Each end surface 115c, slanted at 45° to the substrate surface, serves as a total reflection prism. Each semiconductor laser element, when combined with the end surface 115d and a light emission surface 115e, forms a Fabry-Perot resonator. The end surfaces 115c and 115d are formed by reactive dry etching process (RIE) of the Chlorine family. The semiconductor laser array thus structured is known as disclosed by T. Takamori, L. A. Coldren, and J. L. Merz in their paper: "Lasing Characteristics of a Continuous-Wave Operated Folded-Cavity Surface Emitting Laser", Appl. Phys. Lett. 56 (23), pp2267–2269 (1990). In the semiconductor laser array 115, the distance $r_1$ between the adjacent elements as vertically viewed is 100 μm, and the distance $r_2$ between the adjacent columns of the elements is 300 μm.

Figure 30A:
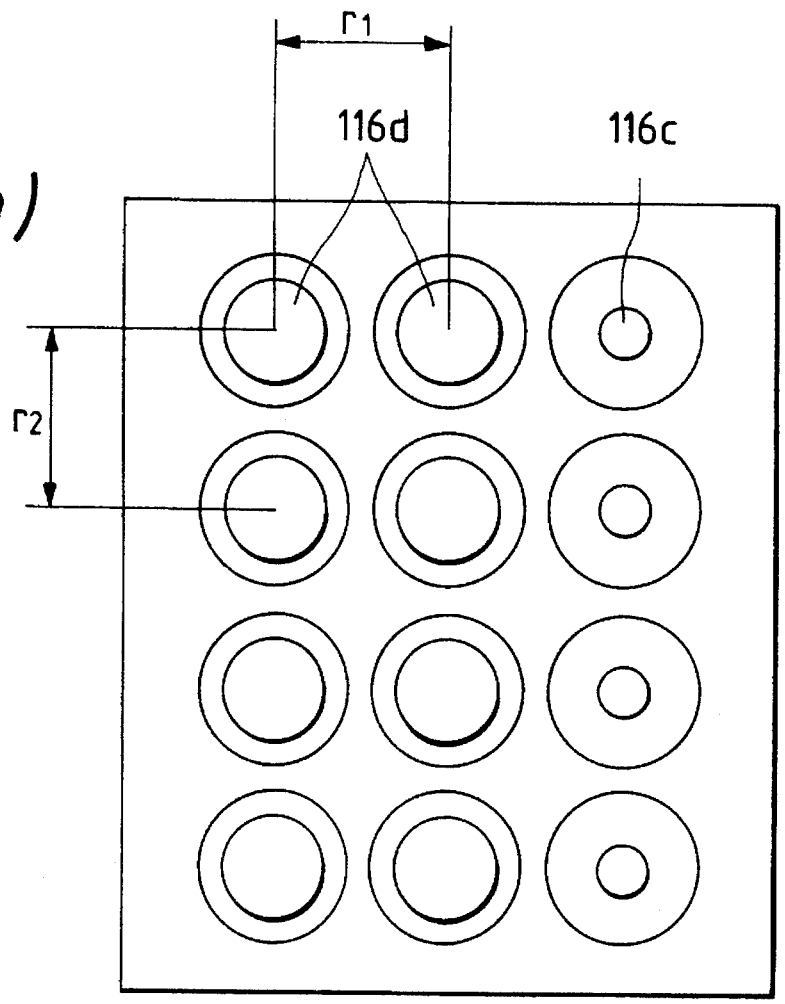
FIG. 30(a) is a plan view showing a micro-collimator lens array used in the optical disk device of FIG. 28.
Figure 30B:
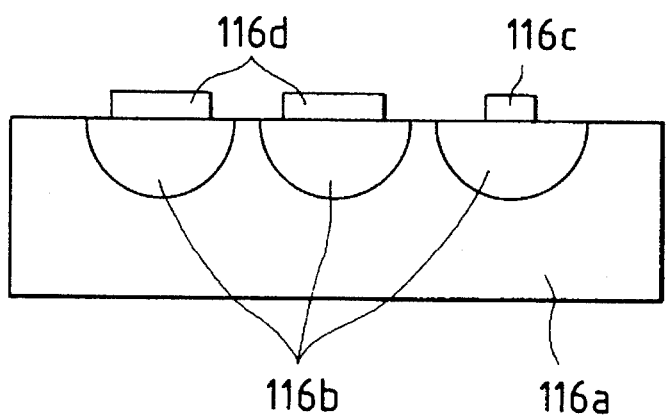
FIG. 30(b) is a sectional view showing the micro-collimator lens array.

The construction of the micro-collimator lens array 116 is illustrated in detail in FIGS. 30(a) and 30(b). As shown, planar micro-lenses 116b of the gradient index (GRIN) type are formed by diffusing metal ions, such as silver ions, thallium ions or the like, into the surface region of a glass substrate 116a. The planar microlens thus structured is known as disclosed by M. Oikawa, K. Iga, and T. Sanada in their paper: "Distributed-Index Planar Micro-Lens Prepared from Ion Exchange Technique", Jpn. Appl. Phys., 20 (4), L296–L298 (1981). Phase shifters 116c and 116d as thin films made of $SiO_2$ or $Si_3N_4$ are formed in the central parts of the planar microlenses 116b, respectively. Each phase shifter functions to cause the optical path difference between the light beam passing through the center of the collimator lens and the light beam passing through the peripheral part of the same. The optical path difference is half of the wave length of the laser light. In this instance, the diameters of the phase shifters 116c and 116d are different from each other. The phase shifter 116c of the small diameter is used for the reading operation, and the phase shifter 116d, for the erasing and writing operations. The element-to-element distance $r_1$ (as viewed horizontally) and the row-to-row distance $r_2$ in the micro-collimator lens array 116 must be selected to be equal to the corresponding distances $r_1$ and $r_2$ in the semiconductor laser array 115.

Returning back to FIG. 28, laser beams emanating from the micro-collimator lens array 116 reach the optical head movable portion 114 after passing through a beam splitter 118a and a beam expander 125. The beam expander 125 includes a concave lens 123 and a convex lens 124. The convex lens 124 is movable in the directions of arrow heads 129 by means of a driver (not shown).

The optical head movable portion 14 includes a prism 126 and a convex lens 127, and is movable bidirectionally as indicated by arrow heads 128 by means of a drive means, not shown. The optical head movable portion 114 further contains a coil 130 for applying a magnetic field. A magnetic field modulated at fixed periods is applied to an optical disk 111 when the data is erased or reproduced. In the optical head movable portion 114, the laser beams are bent by the prism 126 and then are focused on the optical disk 111 by means of the convex lens 127. The optical head movable portion 114 is of the floating type.

The laser beams reflected on the surface of the optical disk 111 pass through the optical head movable portion 114 and the beam expander 125, and reach the beam splitter 118a. The returned laser beams are reflected toward the beam splitter 118b. The beam splitter 118b splits each laser beam into two beams. One of the beams passes through an aperture array 117 with a polarizer and hits a photodiode array 119 where it is converted into an electrical signal as a reproduced signal. The photodiode array 119 is a linear array of photodiodes, viz., consists of photodiodes linearly arrayed. The other laser beam emanating from the beam splitter passes through a cylindrical lens 120 and a lens 121, and hits a quartered photodiode 122 which in turn produces an electrical signal. The produced electrical signal is used for detecting a focus error. A tracking error signal is also generated from the reproduced signal output from the photodiode array 119. The focus error signal detected by the quartered photodiode 122 is used for the focus control.

In the present embodiment, a plurality of laser beams are imaged at extremely close positions on the optical disk 11. Therefore, it is difficult to pick up the focus error signal and the tracking error signal. To cope with this, a time point on which only one of the laser light sources lights is made to recur in the record or reproduction mode, in order to pick up the focus error signal or the tracking error signal. A frequency of appearances of the time point must be selected so as not to interrupt the focus control and the tracking control.

Figure 31:
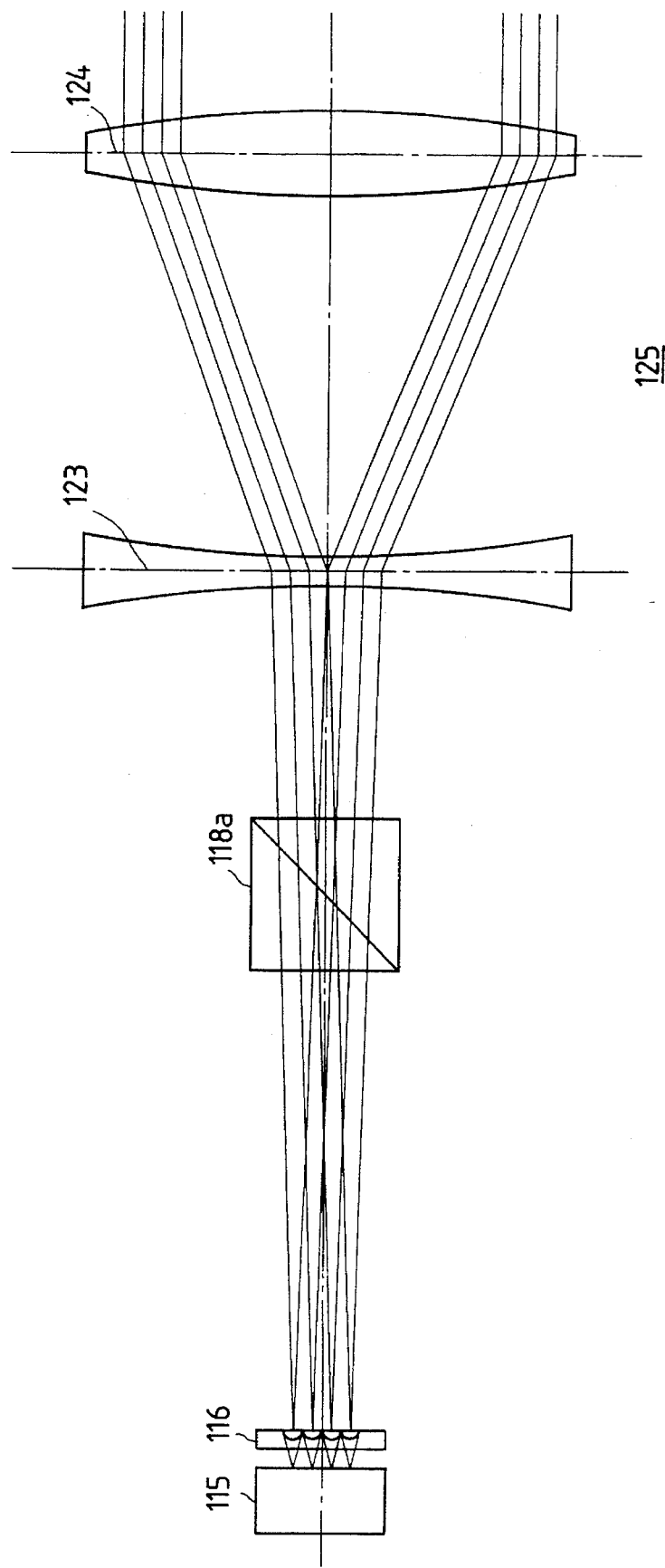
FIG. 31 is a view showing a part of the optical system ranging from a light source to a beam expander, the partial optical system being developed along a plane including an optical axis.

A sectional optical system including the semiconductor laser array 115, micro-collimator lens array 116, beam splitter 118a, concave lens 123, and convex lens 124 is shown in FIG. 31. Since a laser beam emitted from the micro-collimator lens array 116 has a small divergence angle, the beam diameter is expanded by the beam expander 125 including the concave lens 123 and the convex lens 124, thereby to obtain an intended beam diameter.

Figure 32:
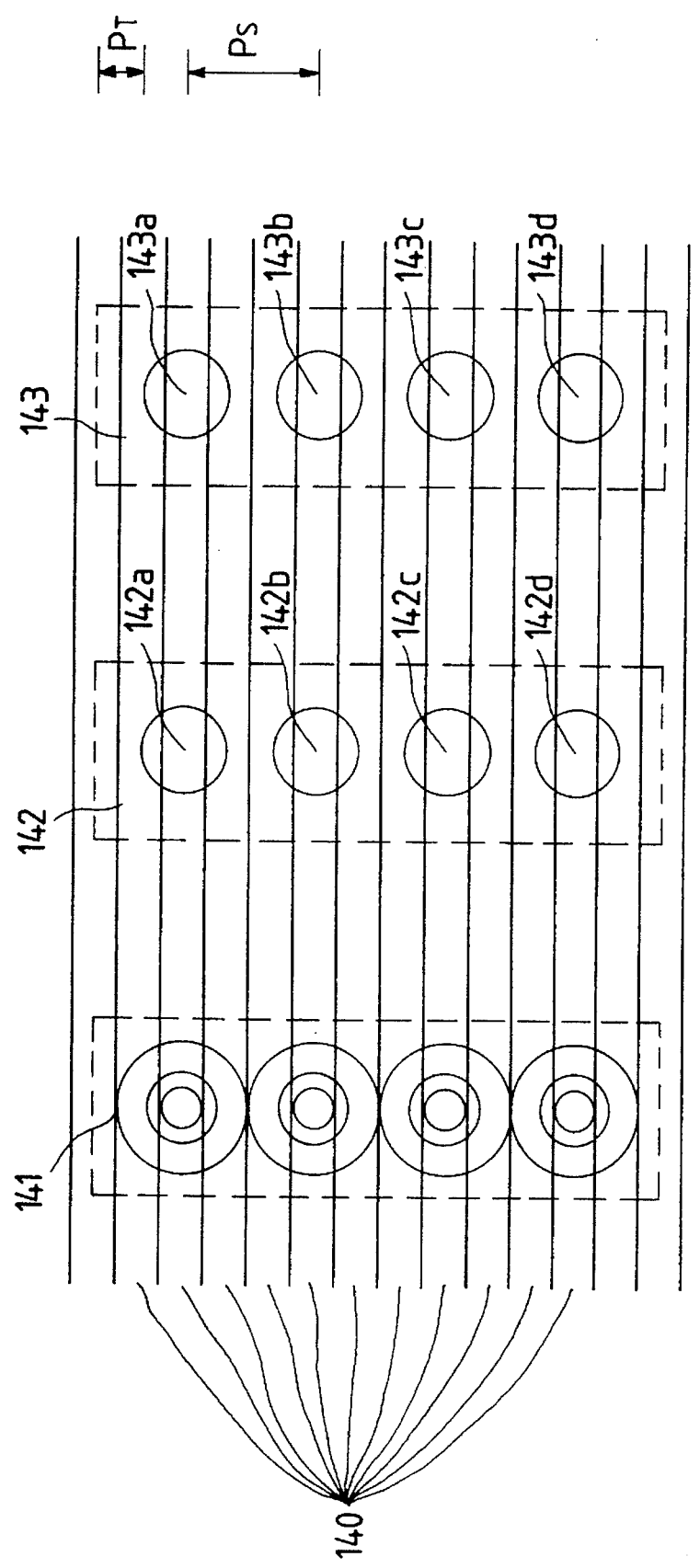
FIG. 32 is a plan view showing an array of laser beam spots formed on the recording surface of an optical disk in the embodiment of FIG. 28.

The laser beam spots formed on the recording surface of the optical disk 111 in the optical system of FIG. 28, is arrayed as shown in FIG. 32. A first group 141 of beam spots is used for reading data out of the optical disk. A second group 142 of beam spots is used for erasing the recorded data. A third group of beam spots 143 is used for recording data. Thus, the first quartet of beam spots for data read, the second quartet of beam spots for data erasure, and the third quartet of beam spots for data write are disposed in this order from upstream of the moving recording medium to downstream. In the first group 141 of beam spots, each spot has a profile as shown in FIG. 22(c). In the second and third groups 142 and 143 of beam spots, each spot has a profile as shown in FIG. 21(c). In those groups 141 to 143 of beam spots, the spot-to-spot distance $P_s$ is larger than the track pitch $P_T$. In this instance, the distance $P_s$ is three times the track pitch $P_T$ since the beam spots for data read have large doughnut-shaped side lobes. The recording tracks present between the adjacent spots are used for data record and read when another scan is performed in an interlaced scanning mode. For the details of the interlaced scanning, reference is made to the paper written by T. Ota, M. Ito and S. Tatsuoka: "Spacing of Laser diode array for Multi-beam Laser Printer using Interlaced scanning", Extended Abstract (Autumn meeting, 1991), The Japan Society of Applied Physics, 11p-ZM-19 (1991).

In this instance, the track pitch $P_T$ of the recording track 40 is 0.8 µm. The element-to-element distance $r_1$ in the semiconductor laser array 115 and the micro-collimator lens array 116 is 100 µm. The principal plane of the micro-collimator lens array 116 is projected onto the recording surface at the magnification β of 0.024 times (=0.8 µm×3/100 µm). This relation is valid for the combination of the recording surface and the aperture array 117. Accordingly, apertures of 16 µm are linearly arrayed at pitches of 100 µm in the aperture array 117.

Figure 33:
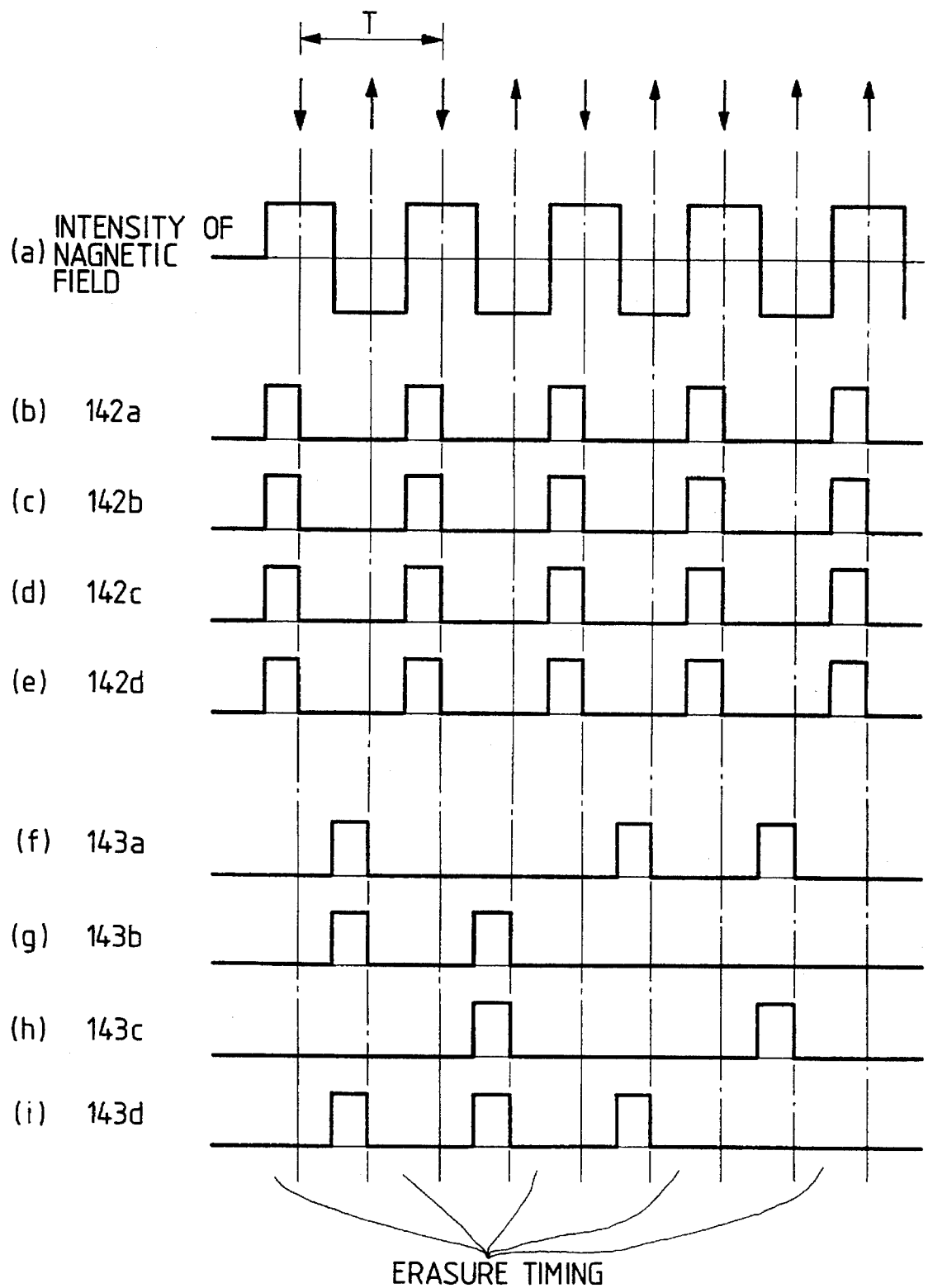
FIG. 33 is a timing chart showing an overwrite operation of the optical disk device of FIG. 28 when the recording medium is of the magneto-optical type.

FIG. 33 is a timing chart showing an overwrite operation of the optical disk device of FIG. 28 when the recording medium is of the magneto-optical type. An alternating current having a predetermined period of time is fed to the coil 130 shown in FIG. 28. An alternating magnetic field developed by the coli is applied to the recording surface of the optical disk 111. A waveform of the magnetic field intensity shown in FIG. 33(a) represents a variation of the alternating magnetic field applied to the recording surface with respect to time. In the graph of FIG. 33, the abscissa represents time. Further, the arrow heads indicate the directions of the magnetic field. The data erasure spots 142a to 142d are lit up at the timings as shown in FIGS. 33(b) to 33(e). The spots 142a to 142d are simultaneously lit with a predetermined period T. The magnetic materials in the recording surface of the disk passing the erasure spot group 142 are unidirectionally magnetized, thereby erasing the data recorded therein. The record spot group 143 is lit when the magnetic field is applied to the recording surface. In this case, the magnetic field applied is opposite in direction to that applied when the erasure spot group is lit. The record spots 143a to 143d shown in FIGS. 33(f) to 33(i) are modulated by an external signal. Accordingly, data to be recorded is recorded on the disk. One period of the alternating magnetic field is selected so as to allow the recording medium to move by the distance substantially equal to the spot diameter.

While in the embodiments thus far described, the optical disk is of the magneto-optical type, it is evident that the present invention is applicable for the optical disk of the phase change type. In the phase-change optical disk system, the coil 130 in FIG. 28 is not required. Data can be erased by anneal if the distance between the erase spot group 142 and the record spot group 143 is properly selected.

The optical head used in the embodiment is the floating optical head of the separation type. As a matter of course, the present invention is applicable to the usual optical head. The invention must additionally use the beam expander, for example, that is not used in the normal optical head. As the result of using the optical disk, the weight of the head is increased and the access speed is slow in a random access mode. In the floating optical head, the additional optical system is installed in the fixed portion of the head, so that the access speed reduction problem will not be created. In this respect, it is preferable to use the floating optical head of the separation type when the present invention is carried out.

Figure 34:
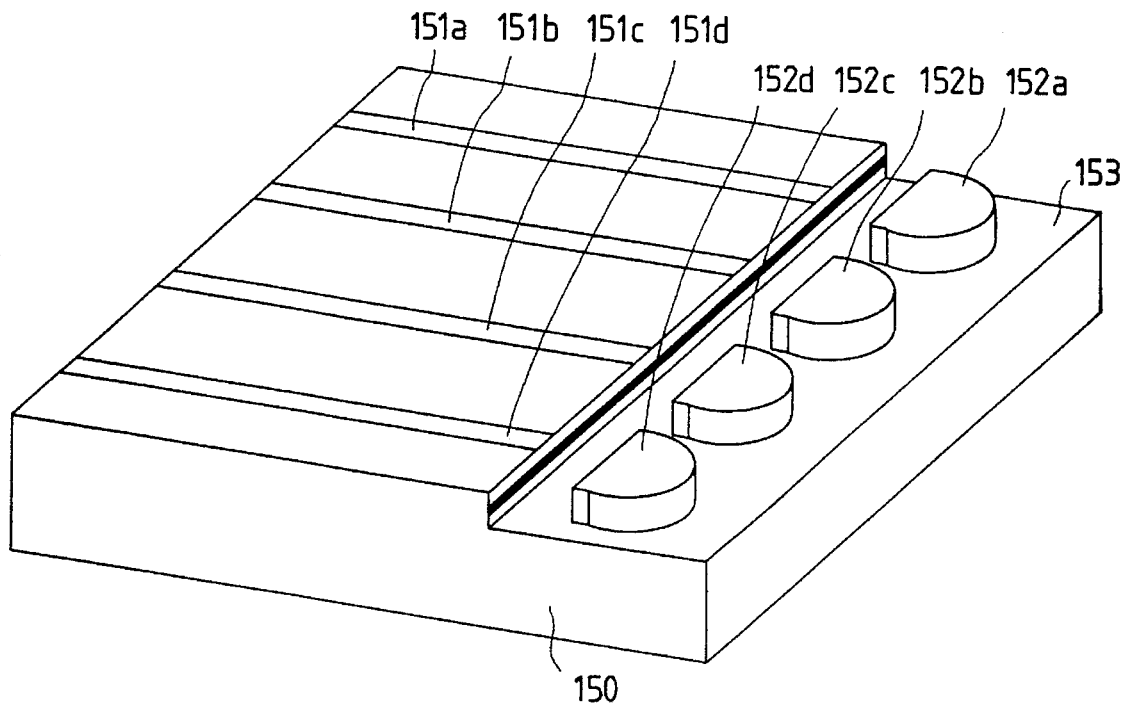
FIG. 34 is a perspective view showing a device in which a semiconductor laser array and a microlens array are formed into a single piece.

Some applications of the optical disk make much account of the data transfer speed rather than the recording density. A multibeam light source in which a semiconductor laser array and a microlens array are fabricated into a single unit as shown in FIG. 34, is suitable for such applications. In the semiconductor laser array, a plurality of semiconductor laser elements are arrayed in the direction orthogonal to the moving direction of the optical disk. In the microlens array, a plurality of microlenses are arrayed in a similar fashion.

To fabricate the semiconductor laser array structured as shown in FIG. 34, a plurality of semiconductor laser elements 151a to 151d are formed on a substrate 150. The substrate 150 having the laser elements formed thereon is dry-etched so that the light emitting end faces of the laser elements 151a to 151d are exposed. As a result, a terrace 153 is formed. Then, SiOx, for example, is deposited over the terrace by the sputtering method. The structure is dry-etched to form cylindrical lenses 152a to 152d, which are respectively associated with the laser elements 151a to 151d.

The semiconductor laser array thus structured and the method of fabricating the same have been known as described by J. Shimada, O. Ohguchi, and R. Sawada in their paper: "Microlens Fabricated by the Planar Process", Journal of Lightwave Technology, Vol. 9, No. 5, pp 571–576 (1991). In place of the microlenses 152a to 152d, a distributed index lens, which serves as a lens vertical to the substrate, may be formed by properly changing the composition ratio in the film formed by depositing SiOx, for example.

Figure 35:
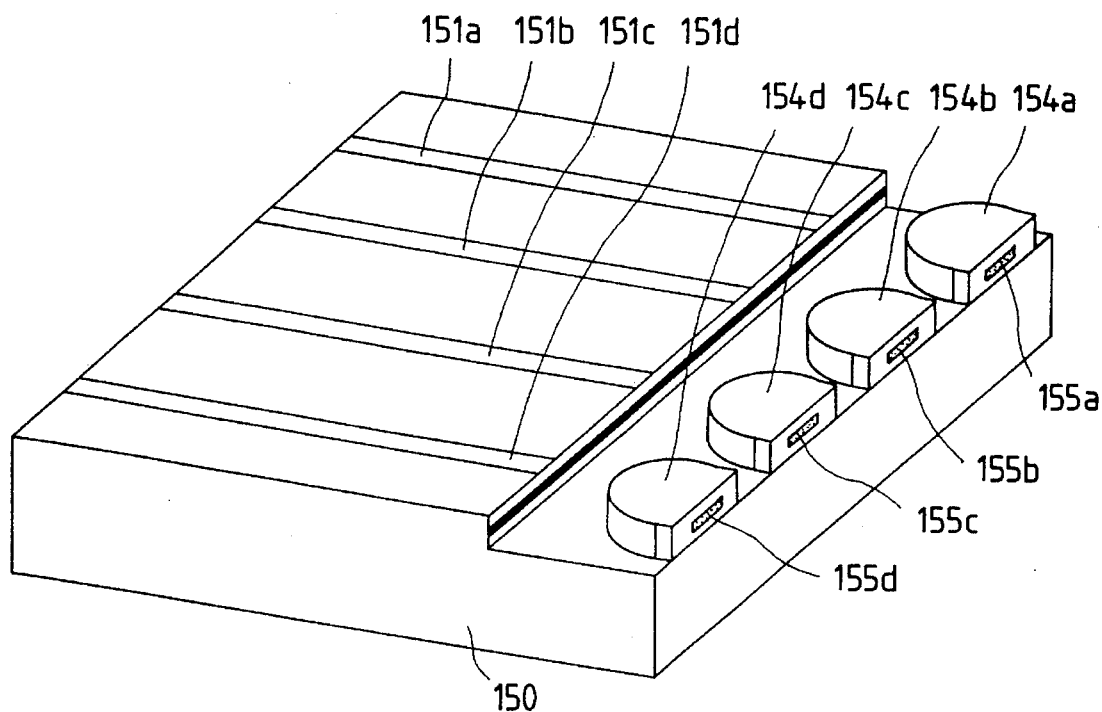
FIG. 35 is a perspective view showing another device in which a semiconductor laser array and a microlens array are formed into a single piece.

The structure of the semiconductor laser array shown in FIG. 34 may be modified into the structure as shown in FIG. 35. In the semiconductor laser array of FIG. 35, microlenses 154a to 154d are formed such that the flat surfaces of the microlenses are directed toward the outside the substrate, as shown in FIG. 35. Phase shifters 155a to 155d are respectively formed on the flat surfaces of the microlenses 154a to 154d by the combination of deposition process and lithography. In this case, the work of forming the phase shifters 155a to 155d is easy since the flat surfaces of the microlens, on which the phase shifters are formed, face outside the substrate.

In another modification, the basic structures of the semiconductor laser array shown in FIG. 34 or 35 is employed. The number of semiconductor laser elements is reduced to 3. The laser elements are arrayed in the same direction as the moving direction of the optical disk, that is, in the track extending direction. The laser beams emitted from the respective semiconductor laser elements can be used for data read, erase, and record. In other words, the usual overwrite system can be realized.

While the two-dimensional semiconductor laser array structured as shown in FIG. 29 is used in the above-mentioned embodiment, a two-dimensional semiconductor laser array in which a diffraction grating or a TJS structure is used in place of the reflecting mirror may be used. Further, instead of ion diffused microlens element, microfresnel lens elements may be used as microlens array 106.

It is evident that the optical disk device of the invention is applicable for every type of recording medium, such as the recording medium of the RO, WORM, phase change, or magneto-optical type. When the invention is applied for the optical disk of the magneto-optical type, the optical disk containing a single magneto-optical recording layer may be used. The optical disk of the single layer structure can be manufactured in a simpler manner than the optical disk of the double-layer structure.

What is claimed is:

1. An information recording device comprising:

light source means including a plurality of laser light sources in a monolithic laser array, which are substantially linearly arrayed and independently driven;

deflecting means for periodically deflecting a plurality of beams of laser light emitted from said light source means in a direction crossing that of an array of said beams;

an image forming optical system for focusing the plurality of laser beams from said deflecting means onto a photoreceptor; and a lens means comprising a monolithic array of microlenses, each of said microlenses being optically coupled to one of said laser light sources, wherein said lens means defines an apparent light source plane behind a light emitting plane of said light source means, and wherein said image forming optical system projects the image of said apparent light source plane on said photoreceptor.

2. An information recording device comprising:

light source means including a plurality of laser light sources comprised of a monolithic laser array, said sources being substantially linearly arrayed and independently driven;

deflecting means for periodically deflecting a plurality of beams of laser light emitted from said light source means in a direction crossing that of an array of said beams;

an image forming optical system for focusing he plurality of laser beams from said deflecting means onto a photoreceptor, said optical system including a monolithic microlens array; and a plurality of collimator optical systems for arranging the laser beams into substantially parallel beams geometrical-optically collimated, each optically coupled to one of said laser light sources, wherein a principal plane of said collimator optical system and an image formed surface of the photoreceptor are disposed in an optically conjugate relationship with respect to said image forming optical system, and wherein said image forming optical system projects the image of said principal plane as an apparent light source plane on said photoreceptor.

3. The information recording device according to claim 1, wherein said microlens array includes a cylindrical lens array disposed such that a direction in which said cylindrical lens array exhibits a lens function is substantially coincident with an array direction of said laser array.

4. The information recording device according to claim 1, wherein said laser array includes a semiconductor laser array formed on a single substrate.

5. The information recording device according to claim 1, wherein a surface of the photoreceptor is scanned with the plurality of laser beams by an interlaced scanning operation.

* * * * *

UNITED STATES PATENT AND TRADEMARK OFFICE
CERTIFICATE OF CORRECTION

PATENT NO. : 5,619,488
DATED : April 8, 1997
INVENTOR(S) : Takeshi OTA et al.

It is certified that error appears in the above-indentified patent and that said Letters Patent is hereby corrected as shown below:

Claim 2, column 21, line 19, "he" should read --the--.

Signed and Sealed this

Fourteenth Day of October, 1997

Attest:

BRUCE LEHMAN

Attesting Officer

Commissioner of Patents and Trademarks